United States Patent
Lin et al.

(10) Patent No.: US 12,554,064 B2
(45) Date of Patent: Feb. 17, 2026

(54) PHOTONIC ASSEMBLY FOR ENHANCED BONDING YIELD AND METHODS FOR FORMING THE SAME

(71) Applicant: Taiwan Semiconductor Manufacturing Company Limited, Hsinchu (TW)

(72) Inventors: Yu-Hung Lin, Taichung (TW); Chih-Hao Yu, Tainan (TW); Wei-Ming Wang, Taichung (TW); Chen Chen, New Taipei (TW); Chia-Hui Lin, Shengang Township (TW); Ren-Fen Tsui, Yungho (TW); Chen-Hua Yu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 195 days.

(21) Appl. No.: 18/501,064

(22) Filed: Nov. 3, 2023

(65) Prior Publication Data

US 2025/0149477 A1 May 8, 2025

(51) Int. Cl.
*G02B 6/13* (2006.01)
*G02B 6/12* (2006.01)
(Continued)

(52) U.S. Cl.
CPC .......... *H01L 24/06* (2013.01); *G02B 6/12004* (2013.01); *G02B 6/13* (2013.01);
(Continued)

(58) Field of Classification Search
None
See application file for complete search history.

(56) References Cited

U.S. PATENT DOCUMENTS

2008/0247704 A1* 10/2008 Kodama .............. H05K 1/0274
385/14
2011/0062571 A1* 3/2011 Slavov .................. H10F 39/804
257/680
(Continued)

FOREIGN PATENT DOCUMENTS

CN 108603980 A 9/2018
CN 116107044 A * 5/2023 ........... G02B 6/4249
(Continued)

OTHER PUBLICATIONS

TW Patent and Trademark Office; TW Application No. 112150533; Office Action mailed Apr. 2, 2025; 10 pages.

*Primary Examiner* — Chris H Chu
(74) *Attorney, Agent, or Firm* — The Marbury Law Group, PLLC

(57) ABSTRACT

A photonic assembly includes: an electronic integrated circuits (EIC) die including a semiconductor substrate, semiconductor devices located on a horizontal surface of the semiconductor substrate, first dielectric material layers embedding first metal interconnect structures, a dielectric pillar structure vertically extending through each layer selected from the first dielectric material layers, a first bonding-level dielectric layer embedding first metal bonding pads, wherein a first subset of the first metal bonding pads has an areal overlap with the dielectric pillar structure in a plan view; and a photonic integrated circuits (PIC) die including waveguides, photonic devices, second dielectric material layers embedding second metal interconnect structures, a second bonding-level dielectric layer embedding second metal bonding pads, wherein the second metal bonding pads are bonded to the first metal bonding pads.

20 Claims, 31 Drawing Sheets

(51) Int. Cl.
  *H01L 23/00* (2006.01)
  *H01L 25/00* (2006.01)
  *H01L 25/18* (2023.01)
(52) U.S. Cl.
  CPC .............. *H01L 24/03* (2013.01); *H01L 24/05* (2013.01); *H01L 24/08* (2013.01); *H01L 24/80* (2013.01); *H01L 25/18* (2013.01); *H01L 25/50* (2013.01); *H01L 24/16* (2013.01); *H01L 24/32* (2013.01); *H01L 24/73* (2013.01); *H01L 2224/0345* (2013.01); *H01L 2224/03452* (2013.01); *H01L 2224/03462* (2013.01); *H01L 2224/03845* (2013.01); *H01L 2224/05166* (2013.01); *H01L 2224/05181* (2013.01); *H01L 2224/05186* (2013.01); *H01L 2224/05546* (2013.01); *H01L 2224/05554* (2013.01); *H01L 2224/05555* (2013.01); *H01L 2224/05647* (2013.01); *H01L 2224/0603* (2013.01); *H01L 2224/06132* (2013.01); *H01L 2224/06181* (2013.01); *H01L 2224/08145* (2013.01); *H01L 2224/16227* (2013.01); *H01L 2224/32225* (2013.01); *H01L 2224/73204* (2013.01); *H01L 2224/80201* (2013.01); *H01L 2224/80357* (2013.01); *H01L 2224/80379* (2013.01); *H01L 2224/80895* (2013.01); *H01L 2224/80896* (2013.01); *H01L 2924/04941* (2013.01); *H01L 2924/04953* (2013.01); *H01L 2924/0496* (2013.01); *H01L 2924/0544* (2013.01)

(56) References Cited

U.S. PATENT DOCUMENTS

| | | | | |
|---|---|---|---|---|
| 2014/0264857 | A1* | 9/2014 | Wu | H01L 23/3121 |
| | | | | 174/257 |
| 2015/0380385 | A1* | 12/2015 | Hsu | H01L 21/30604 |
| | | | | 438/459 |
| 2020/0200972 | A1* | 6/2020 | Steglich | G01N 21/7703 |
| 2022/0155539 | A1 | 5/2022 | Pietambaram et al. | |
| 2024/0111095 | A1* | 4/2024 | Tanaka | G02B 6/1226 |
| 2025/0300086 | A1* | 9/2025 | Ecton | H01L 25/18 |

FOREIGN PATENT DOCUMENTS

| | | | | |
|---|---|---|---|---|
| EP | 3671187 A1 | * | 6/2020 | ......... G01N 21/7703 |
| JP | 2019114602 A | | 7/2019 | |
| TW | 202242463 A | | 11/2022 | |
| TW | 202318049 A | | 5/2023 | |
| TW | 202322229 A | | 6/2023 | |

* cited by examiner

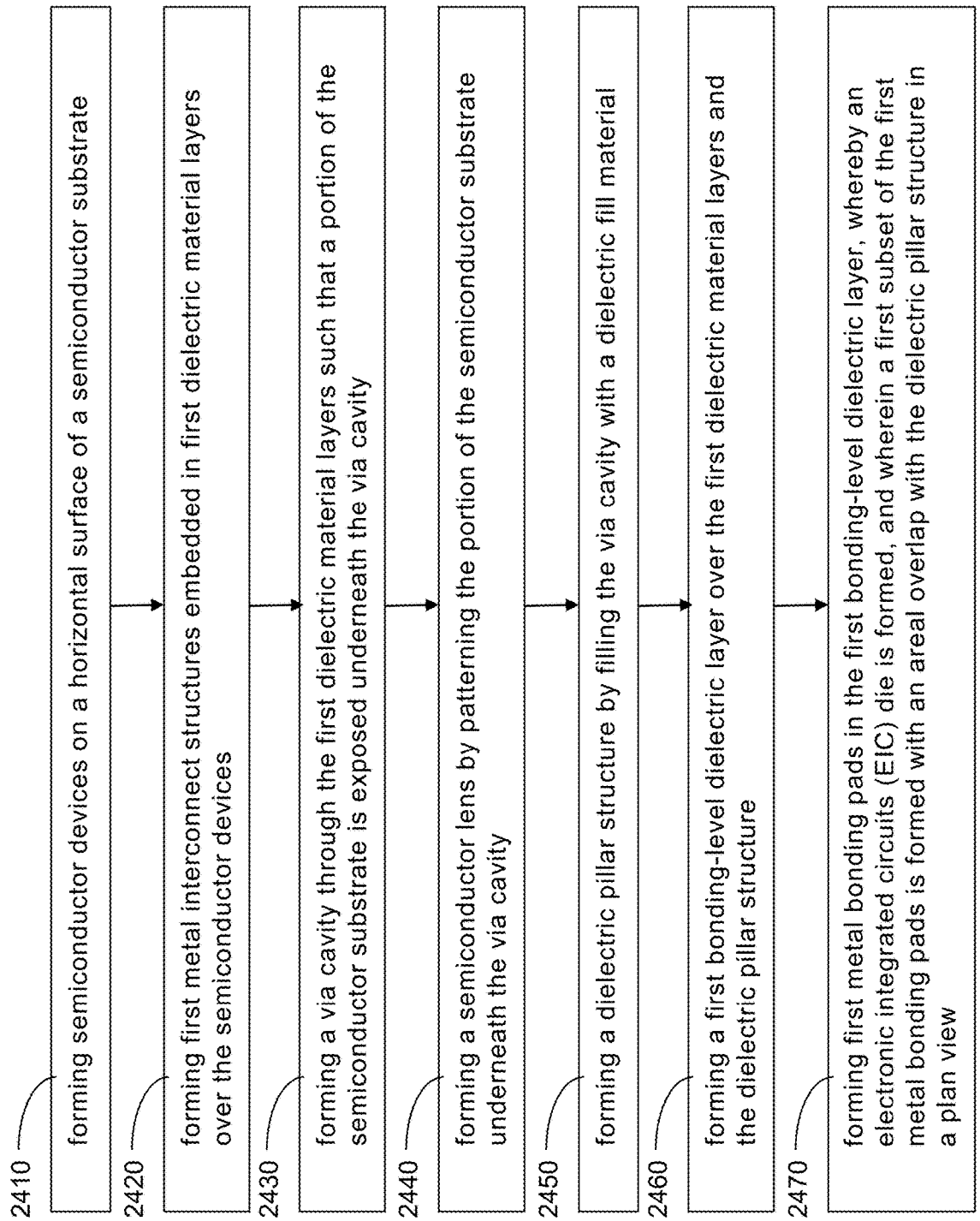

PHOTONIC ASSEMBLY FOR ENHANCED BONDING YIELD AND METHODS FOR FORMING THE SAME

BACKGROUND

Photonic integrated circuits (PICs) and electronic integrated circuits (EICs) are extensively used in modern electronics. EICs include semiconductor devices formed in a semiconductor die. PICs include photonic components formed in a photonic die. PICs rely on light energy, and are supported by laser sources that enhance integration, speed, and heat reduction. The fabrication of PICs may use monolithic photonic integration or hybrid photonic integration. The utility of PICs spans across applications such as automotive sensors, healthcare systems, and data communication. PICs offer advantages such as energy efficiency, high speed, and integration compatibility with electronic integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 24 is a flowchart illustrating general processing steps for forming a photonic assembly of the present disclosure.

DETAILED DESCRIPTION

Figure 1:
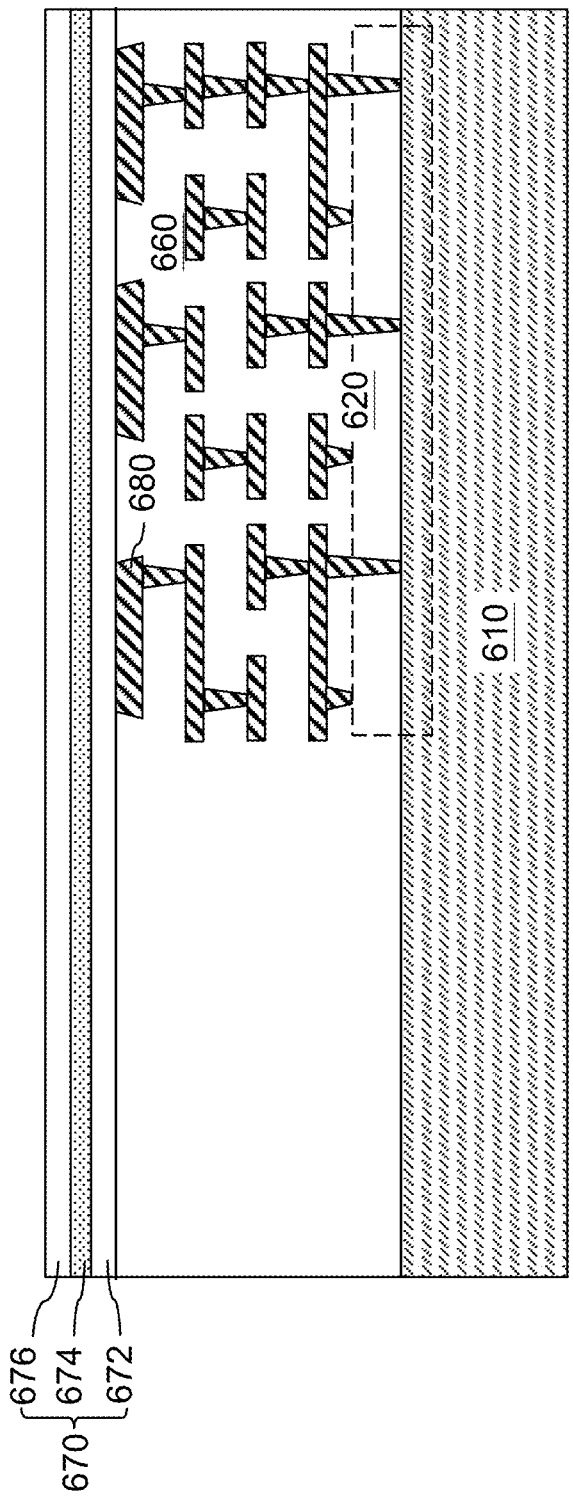
FIG. 1 is a vertical cross-sectional view of a first intermediate embodiment structure for forming an electronic integrated circuits (EIC) die after formation of passivation-level dielectric layers according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Elements with the same reference numerals are presumed to be the same element or similar elements, and are presumed to have the same material composition and provide the same function, unless expressly described otherwise.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise. As used herein, an element or a system "configured for" a function or an operation or "configured to" provide or perform a function or an operation refers to an element or a system that is provided with hardware, and with software as applicable, to provide such a function or such an operation as described in the present disclosure, and as known in the art in the event any details of such hardware or such software are not expressly described herein.

A compact universal photonic engine (COUPE) includes a combination of PICs and EICs that provides optical-electrical transmission. A COUPE allows for the processing of optical signals using an electronic signal transmission system. A COUPE integrates various optical components, electro-optics transition devices, and optical fibers. In optical-electrical devices, laser light plays a pivotal role. Optical fibers may be used to feed laser light to a COUPE.

Various embodiments disclosed herein may provide a photonic assembly including a PIC die and an EIC die in which the EIC die comprises a dielectric pillar structure located in an optical path. Metal bonding pads in the EIC die may be arranged such that a first subset of the metal bonding pads are formed in a peripheral area of the dielectric pillar structure that laterally surrounds the area of the optical path, while a second subset of the metal bonding pads are formed outside the area of the dielectric pillar structure. The first subset of the metal bonding pads is arranged around an optical path region to prevent blockage of an optical path through the EIC die. The first subset of the metal bonding pads provide additional bonding between a subset of metal bonding pads in the PIC die to increase the bonding strength between the EIC die and the PIC die. The various embodiments of the present disclosure are now described with reference to accompanying drawings.

Referring to FIG. 1, a first intermediate embodiment structure for forming an electronic integrated circuits (EIC) die is illustrated. The first embodiment structure may comprise a semiconductor substrate 610, which may be a portion of a semiconductor wafer such as a commercially available silicon wafer having a diameter of 150 mm, 200 mm, 300 mm, or 450 mm. In one embodiment, a two-dimensional periodic array of EIC dies may be formed on the semiconductor wafer using a sequence of processing steps described herein. The illustrated portion of the first embodiment structure corresponds to a unit area for forming a single EIC die within a two-dimensional array of unit areas for forming the two-dimensional periodic array of EIC dies.

Semiconductor devices 620 may be formed on the semiconductor substrate 610 within each unit area of the first embodiment structure. The semiconductor devices 620 may comprise any set of semiconductor devices known in the art for forming electronic integrated circuits. For example, the semiconductor devices 620 may comprise field effect transistors, diodes, resistors, capacitors, inductors, or various other types of semiconductor devices that may be manufactured on a semiconductor substrate.

First metal interconnect structures 680 formed within first dielectric material layers 660 may be formed over the semiconductor devices 620 and the semiconductor substrate 610. Each of the first dielectric material layers 660 comprises an interlayer dielectric (ILD) material such as undoped silicate glass, a doped silicate glass, organosilicate glass, silicon nitride, silicon oxynitride, silicon carbide nitride, a dielectric metal oxide, etc. The first dielectric material layers 660 are also referred to as EIC interconnect-level dielectric layers. The first metal interconnect structures 680 are also referred to EIC metal interconnect structures.

The first metal interconnect structures 680 comprise first metal lines and first metal via structures at various levels of the first dielectric material layers 660. The first metal interconnect structures 680 may comprise tungsten, copper, or aluminum. Other suitable metal materials are within the contemplated scope of disclosure. Each of the first metal interconnect structures 680 may be formed by a single damascene method, a dual damascene method, or by deposition of a metallic material and patterning of the metallic material using a combination of lithographically patterned etch mask (such as a patterned photoresist layer) and an anisotropic etch process. The total number of metal line levels in the first metal interconnect structures 680 may be in a range from 1 to 20, although a greater number of metal line levels may also be used. In some embodiments, a topmost level of the first metal interconnect structures 680 may comprise aluminum-based metal pads. A region that is free of any first metal interconnect structures 680 may be formed within each unit area of the first embodiment structure. This region is subsequently used to form an optical path.

Passivation-level dielectric layers 670 may be formed over the first dielectric material layers 660. The passivation-level dielectric layers 670 may comprise at least one dielectric diffusion barrier layer that may block diffusion of hydrogen, moisture, and metallic impurities therethrough. In an illustrative example, the passivation-level dielectric layers 670 may comprise a first passivation-level dielectric layer 672 including a first silicon oxide, a second passivation-level dielectric layer 674 including a dielectric diffusion barrier material such as silicon nitride or silicon nitride carbide, and a third passivation-level dielectric layer 676 including a second silicon oxide. The first passivation-level dielectric layer 672 may have a thickness in a range from 50 nm to 500 nm, although lesser and greater thicknesses may also be used. The second passivation-level dielectric layer 674 may have a thickness in a range from 50 nm to 500 nm, although lesser and greater thicknesses may also be used. The third passivation-level dielectric layer 676 may have a thickness in a range from 50 nm to 1000 nm, although lesser and greater thicknesses may also be used.

Figure 2A:
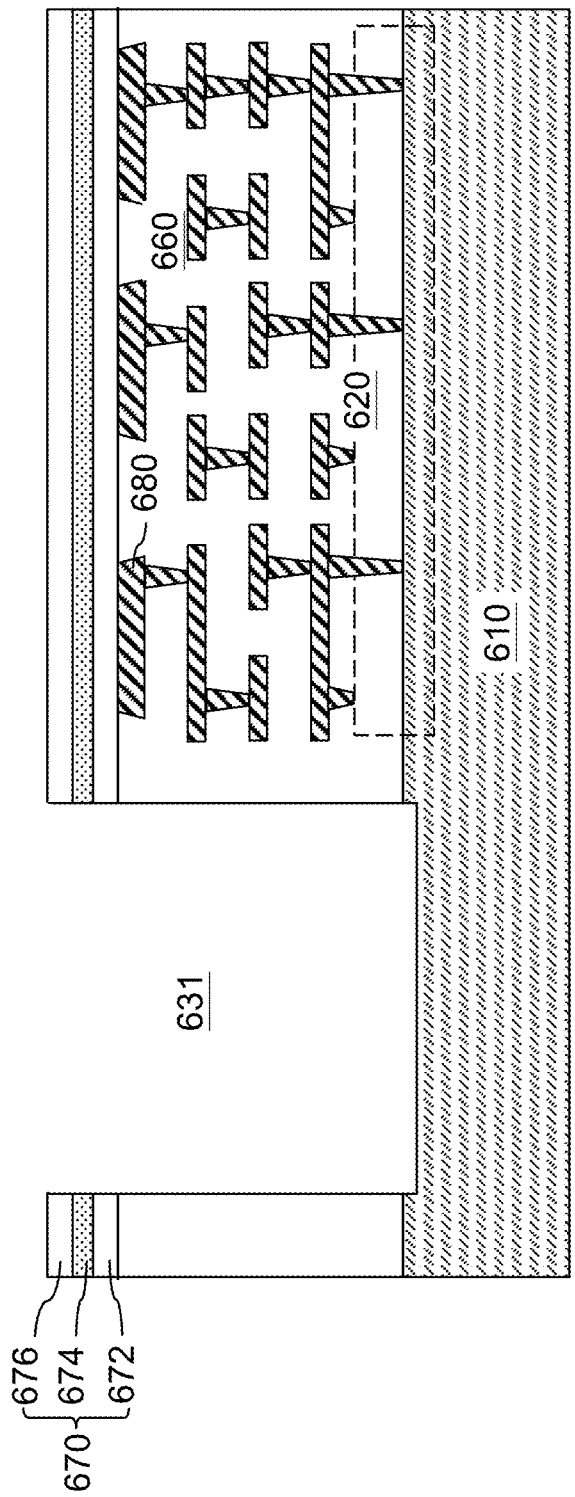
FIG. 2A is a vertical cross-sectional view of the first intermediate embodiment structure after formation of a via cavity according to the first embodiment of the present disclosure.
Figure 2B:
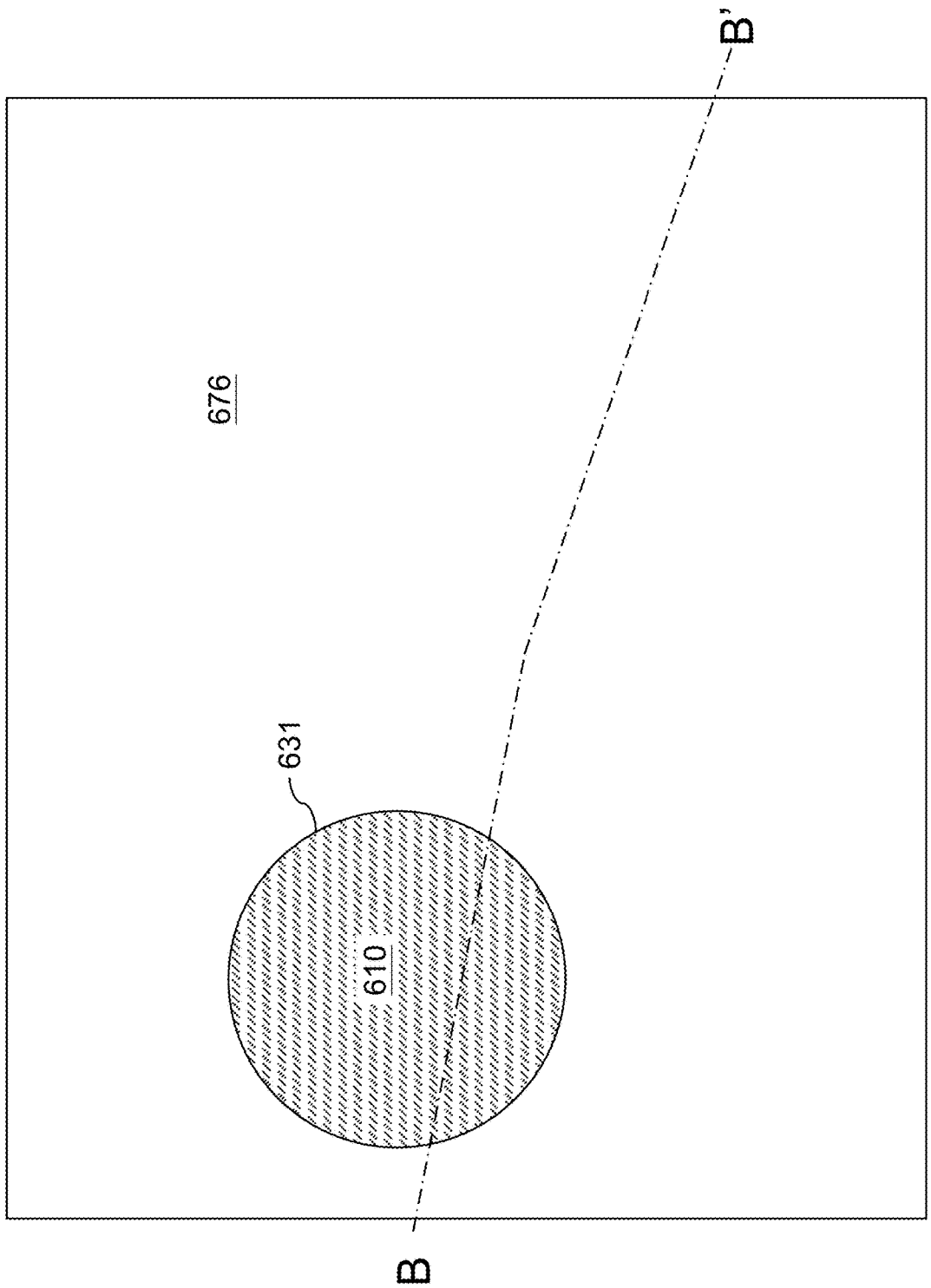
FIG. 2B is a top-down view of the first intermediate embodiment structure of FIG. 2A. The hinged vertical plane A-A' is the cut plane of the vertical cross-sectional view of FIG. 2A.

Referring to FIGS. 2A and 2B, a photoresist layer (not shown) may be applied over the passivation-level dielectric layers 670, and may be lithographically patterned to form an opening in an area that is free of the first metal interconnect structures 680 in a plan view. As used herein, a plan view refers to a view in which all elements in a structure are shown in a projection along a vertical direction onto a horizontal plane. In the first embodiment structure, a vertical direction refers to a direction that is perpendicular to a top surface of the semiconductor substrate 610, and a horizontal plane refers to any plane that is perpendicular to the vertical direction. The opening in the photoresist layer may be large enough to accommodate optical beam paths to be formed in an EIC die. For example, the opening in the photoresist layer may have a diameter in a range from 100 microns to 600 microns, such as 200 microns to 400 microns, although lesser and greater diameters may also be used.

An anisotropic etch process may be performed to transfer the pattern of the opening in the photoresist layer through the passivation-level dielectric layers 670, the first dielectric material layers 660, and optionally partly into an upper portion of the semiconductor substrate 610. A via cavity 631 may be formed through the passivation-level dielectric layers 670, the first dielectric material layers 660, and optionally into an upper portion of the semiconductor substrate 610. The via cavity 631 may have a circular or substantially circular horizontal cross-sectional area. The via cavity 631 may have a cylindrical vertically-extending straight sidewall that extends from the semiconductor substrate 610 to a topmost surface of the passivation-level dielectric layers 670. A recessed horizontal surface and a cylindrical vertically-extending surface of the semiconductor substrate 610 may be physically exposed in the bottom portion of the via cavity 631. The photoresist layer may be subsequently removed, for example, by ashing.

Figure 3:
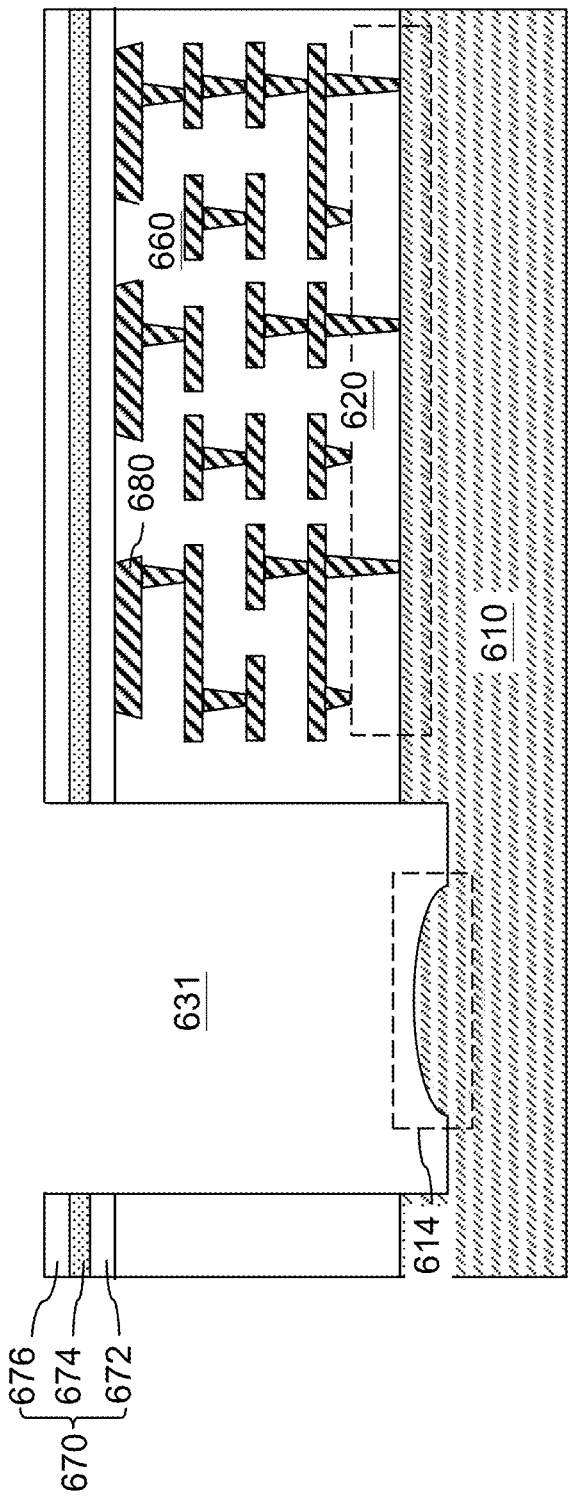
FIG. 3 is a vertical cross-sectional view of the first intermediate embodiment structure after formation of a semiconductor lens according to the first embodiment of the present disclosure.

Referring to FIG. 3, a physically exposed portion of the semiconductor substrate 610 may be patterned to form a semiconductor lens 614. The semiconductor lens 614 may be a focusing lens that reduces the beam width of the optical beam that passes through the semiconductor lens 614. In one embodiment, the semiconductor lens 614 may have a convex semiconductor surface such that a center portion of the convex semiconductor surface is at the highest point and the periphery of the convex semiconductor surface is at the lowest point.

The semiconductor lens 614 may be formed by any semiconductor lens patterning method known in the art. For example, a grayscale photoresist layer (not shown) may be applied into the via cavity 631 and over the passivation-level dielectric layers 670, and may be lithographically patterned to form a photoresist material portion having a variable thickness profile. An anisotropic etch process that etches the material of the semiconductor substrate 610 selective to the dielectric material of the third passivation-level dielectric layer 676 may be performed to form the semiconductor lens 614. It is understood that the drawings are generally not drawn to scale, and the diameter of the via cavity 631 may be greater than the depth of the via cavity 631 at least by a factor of 3, and/or at least by a factor of 10 or more. Thus, formation of a suitable patterned grayscale photoresist material portion in the via cavity 631 is practicable. Alternative patterning methods may also be used to form the semiconductor lens 614.

Generally speaking, a semiconductor lens 614 may be formed by patterning the portion of the semiconductor substrate 610 underneath the via cavity 631. The semiconductor lens 614 may comprise a portion of the semiconductor substrate 610, may have a convex semiconductor surface, and may be formed at the bottom of the via cavity 631. The diameter of the semiconductor lens 614 may be in a range from 20% to 95%, such as from 30% to 90%, of the diameter of the via cavity 631. The height of the semiconductor lens 614 may be in a range from 100 nm to 10,000 nm, although lesser and greater heights may also be used.

Figure 4:
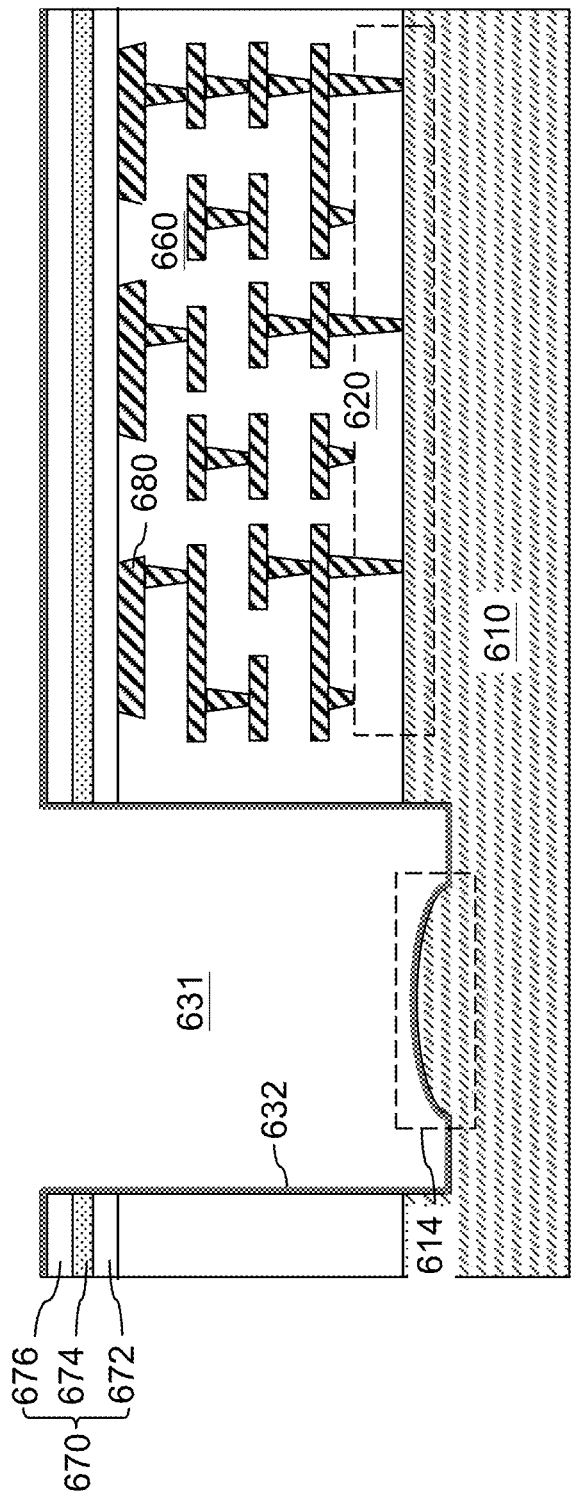
FIG. 4 is a vertical cross-sectional view of the first intermediate embodiment structure after formation of a dielectric protection liner according to the first embodiment of the present disclosure.

Referring to FIG. 4, a dielectric protection liner 632 may be conformally deposited on the physically exposed surfaces of the semiconductor lens 614, the first dielectric material layers 660, and the passivation-level dielectric layers 670. The dielectric protection liner 632 comprises at least one dielectric material such as silicon nitride, silicon oxynitride, silicon oxide, silicon carbide nitride, at least one dielectric metal oxide, or a combination thereof. Other suitable dielectric materials are within the contemplated scope of disclosure. The dielectric protection liner 632 may be deposited by a conformal deposition process such as a chemical vapor deposition process or an atomic layer deposition process. The thickness of the dielectric protection liner 632 may be in a range from 10 nm to 1000 nm, although lesser and greater thicknesses may also be used.

The dielectric protection liner 632 contacts each of the first dielectric material layers 660, the convex semiconductor surface of the semiconductor lens 614, and a vertically-extending sidewall of the semiconductor substrate 610. The dielectric protection liner 632 comprises a cylindrical vertically-extending portion that contacts each of the first dielectric material layers 660 and the vertically-extending sidewall of the semiconductor substrate 610, and further comprises a horizontally-extending portion that contacts the top surface of the topmost layer of the passivation-level dielectric layers 670. The dielectric protection liner 632 comprises a contoured bottom portion having a concave bottom surface that contacts the convex top surface of the semiconductor lens 614. The thickness of the dielectric protection liner 632 may be selected to minimize reflection at the interface with the semiconductor lens 614 by avoiding constructive interference of reflected components of light generated at the top surface and at the bottom surface of the contoured portion of the dielectric protection liner 632.

Figure 5:
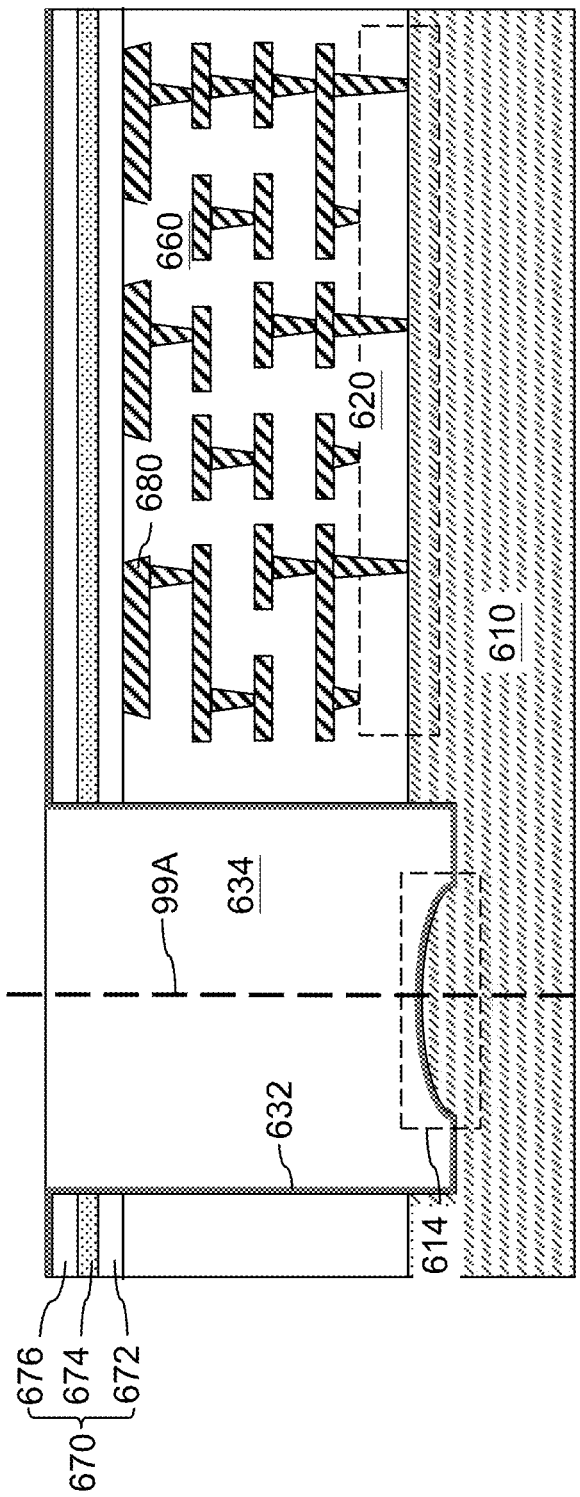
FIG. 5 is a vertical cross-sectional view of the first intermediate embodiment structure after formation of a dielectric pillar structure in the via cavity according to the first embodiment of the present disclosure.

Referring to FIG. 5, a dielectric fill material may be deposited in the remaining volume of the via cavity 631. The dielectric fill material may comprise a planarizable optically transparent dielectric material such as silicon oxide or a polymer material. Excess portions of the dielectric fill material may be removed from above the horizontal plane including the topmost horizontal surface of the horizontally-extending portion of the dielectric protection liner 632 overlying the passivation-level dielectric layers 670 by performing a planarization process. The planarization process may comprise a chemical mechanical polishing process. The remaining portion of the dielectric fill material located within the via cavity 631 constitutes a dielectric pillar structure 634. The top surface of the dielectric pillar structure 634 may be located within the horizontal plane including the top surface of the horizontally-extending portion of the dielectric protection liner 632. A first optical path 99A is formed through a center portion of the dielectric pillar structure 634, the semiconductor lens 614, and an underlying portion of the semiconductor substrate 610.

Figure 6:
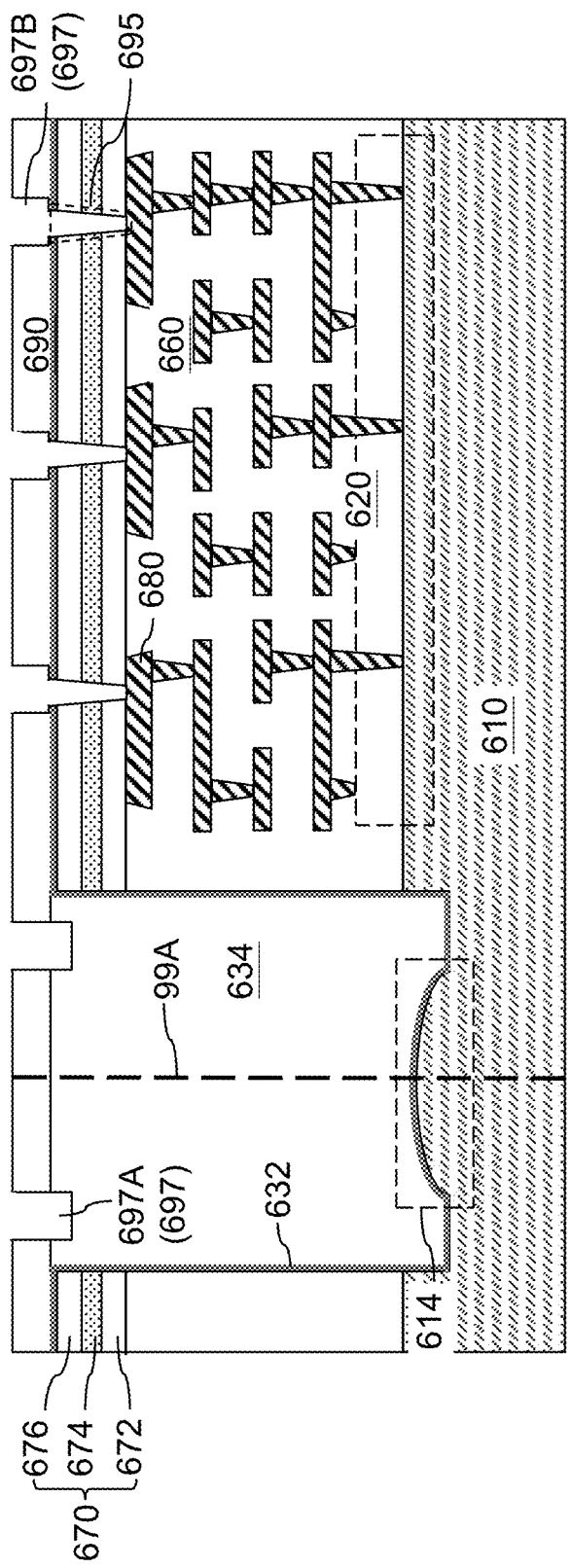
FIG. 6 is a vertical cross-sectional view of the first intermediate embodiment structure after formation of a first bonding-level dielectric layer, pad cavities, and integrated pad-and-via cavities according to the first embodiment of the present disclosure.

Referring to FIG. 6, a dielectric material may be deposited over the horizontally-extending portion of the dielectric protection liner 632 and the dielectric pillar structure 634 to form a first bonding-level dielectric layer 690. The dielectric material comprises a material that may be used to dielectric-to-dielectric bonding. For example, the dielectric material of the first bonding-level dielectric layer 690 may comprise undoped silicate glass or a doped silicate glass. The thickness of the first bonding-level dielectric layer 690 may be in a range from 10 nm to 5 microns, although lesser and greater thicknesses may also be used. The first bonding-level dielectric layer 690 may be in contact with the horizontally-extending portion of the dielectric protection liner 632, and may be in contact with the top surface of the dielectric pillar structure 634.

A first photoresist layer (not shown) may be applied over the first bonding-level dielectric layer 690, and may be lithographically patterned to form a pattern of discrete openings that overlie a subset of the first metal interconnect structures 680 that is located at the topmost level of the first metal interconnect structures 680. A first anisotropic etch process may be performed to form discrete via openings through the first bonding-level dielectric layer 690 and the horizontally-extending portion of the dielectric protection liner 632 and optionally into one or more of the passivation-level dielectric layers 670. The first photoresist layer may be removed, for example, by ashing.

A second photoresist layer (not shown) may be applied over the first bonding-level dielectric layer 690, and may be lithographically patterned to form discrete openings having a pattern of bonding pads. According to an aspect of the present disclosure, a first subset of the discrete openings may be formed within the area enclosed by the sidewall of the via cavity 631 (which is now filled with the dielectric pillar structure 634 and portions of the dielectric protection liner 632) in the plan view, i.e., within the area defined by the outer sidewall of the vertically-extending portion of the dielectric protection liner 632 in the plan view. Further, a center region of the area defined by the sidewall of the via cavity 631 in the plan view is free of any opening in the second photoresist layer so that the openings in the second photoresist layer do not have any areal overlap with the first optical path 99A. A second subset of the discrete openings may be formed outside the area enclosed by the sidewall of the via cavity 631 in the plan view such that each discrete opening in the second subset encloses an area of a respective via opening through the first bonding-level dielectric layer 690.

A second anisotropic etch process may be performed to transfer the pattern of the openings in the second photoresist layer through the first bonding-level dielectric layer 690. Pad-shaped cavities are formed through the first bonding-level dielectric layer 690 underneath the discrete openings in the second photoresist layer, and the pre-existing via openings through the first bonding-level dielectric layer 690, the dielectric protection liner 632, and optionally through one or more of the passivation-level dielectric layers 670 may be vertically extended through the entirety of the passivation-level dielectric layers 670 to a top surface of a respective first metal interconnect structure 680 at the topmost level of the first metal interconnect structures 680.

Pad-level cavities 697A are formed through the first bonding-level dielectric layer 690 underneath the first subset of the discrete openings in the second photoresist layer, and integrated pad-and-via cavities 697B are formed through the first bonding-level dielectric layer 690 underneath the second subset of the discrete openings in the second photoresist layer. The pad-level cavities 697A and the integrated pad-and-via cavities 697B are collectively referred to as pad cavities 697. In one embodiment, the pad-level cavities 697A may vertically extend into an upper portion of the dielectric pillar structure 634. Each integrated pad-and-via cavity 697B may comprise a pad cavity portion that is formed through the first bonding-level dielectric layer 690, and a via cavity portion 695 that vertically extends through the dielectric protection liner 632 and the passivation-level dielectric layers 670. In one embodiment, the chemistry of the second anisotropic etch process may be selective to the material of the dielectric protection liner 632, and the depth of each pad cavity portion may be the same as the thickness of the first bonding-level dielectric layer 690. The second photoresist layer may be removed, for example, by ashing.

While the present disclosure is described using an embodiment in which via openings are formed prior to formation of pad-level cavities using a via-first dual patterning process, embodiments are expressly contemplated herein in which the pad-level cavities are formed prior to formation of the via openings.

Figure 7A:
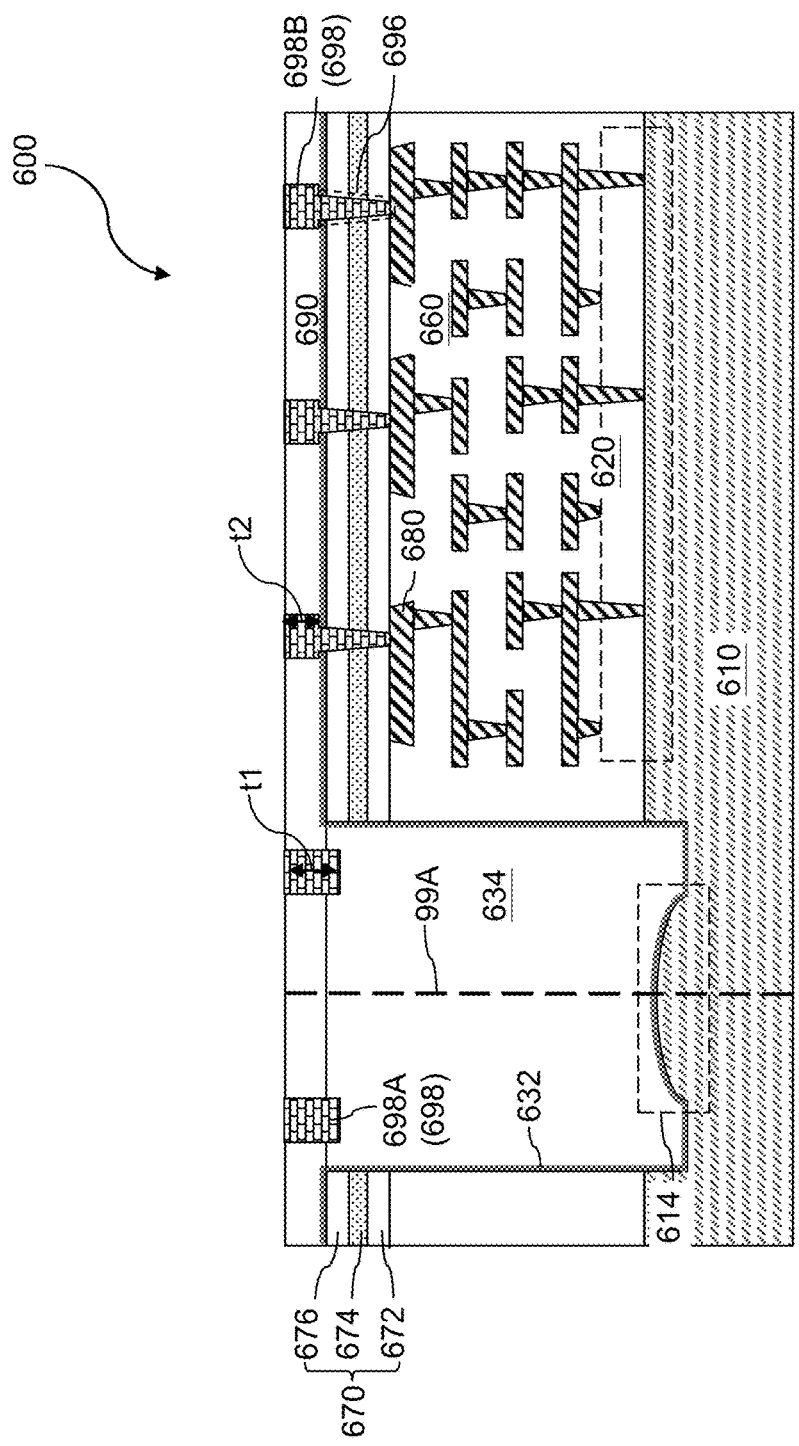
FIG. 7A is a vertical cross-sectional view of first intermediate embodiment structure after formation of first metal bonding pads according to the first embodiment of the present disclosure.
Figure 7B:
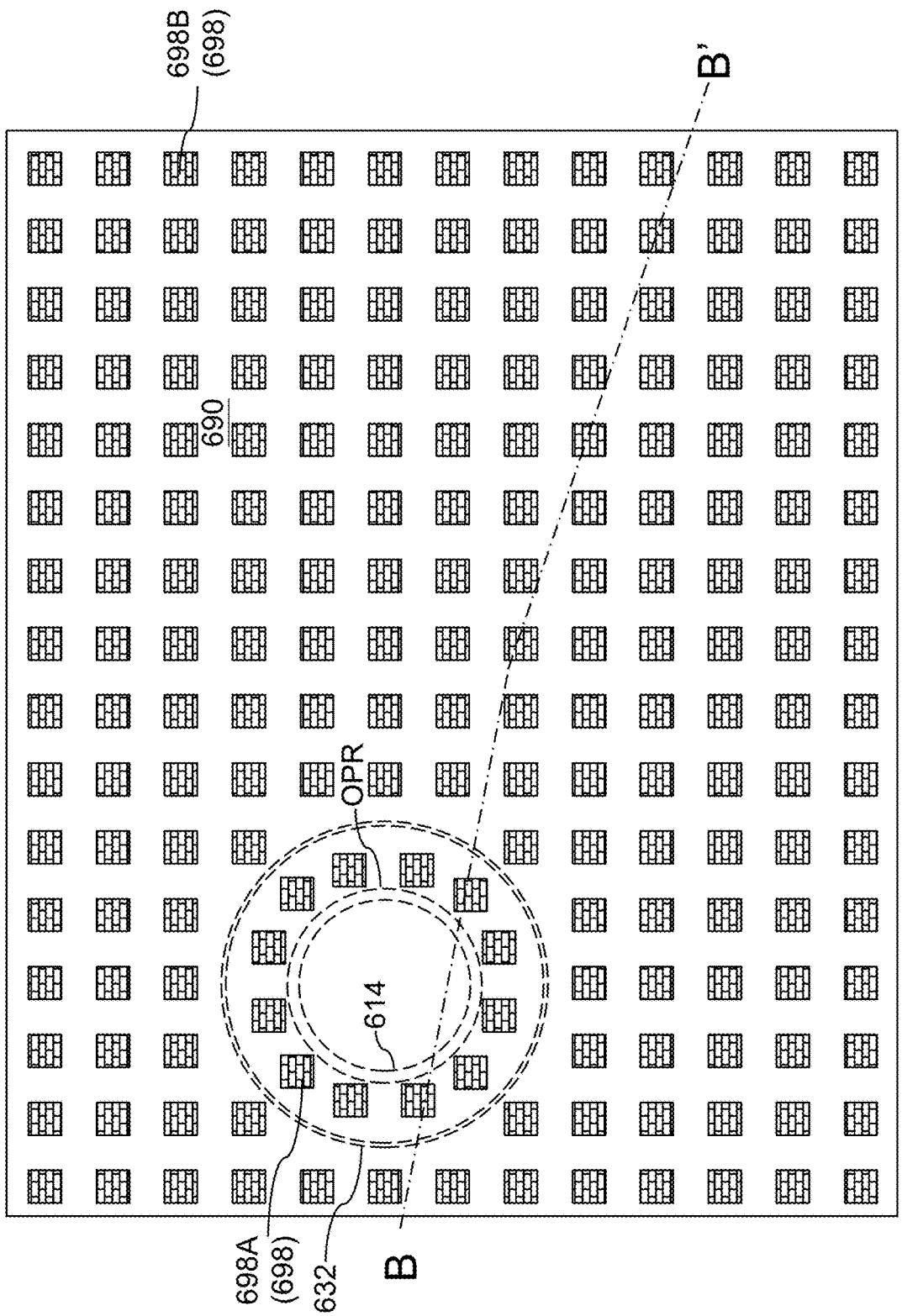
FIG. 7B is a top-down view of the first intermediate embodiment structure of FIG. 7A. The hinged vertical plane A-A' is the cut plane of the vertical cross-sectional view of FIG. 7A.
Figure 7C:
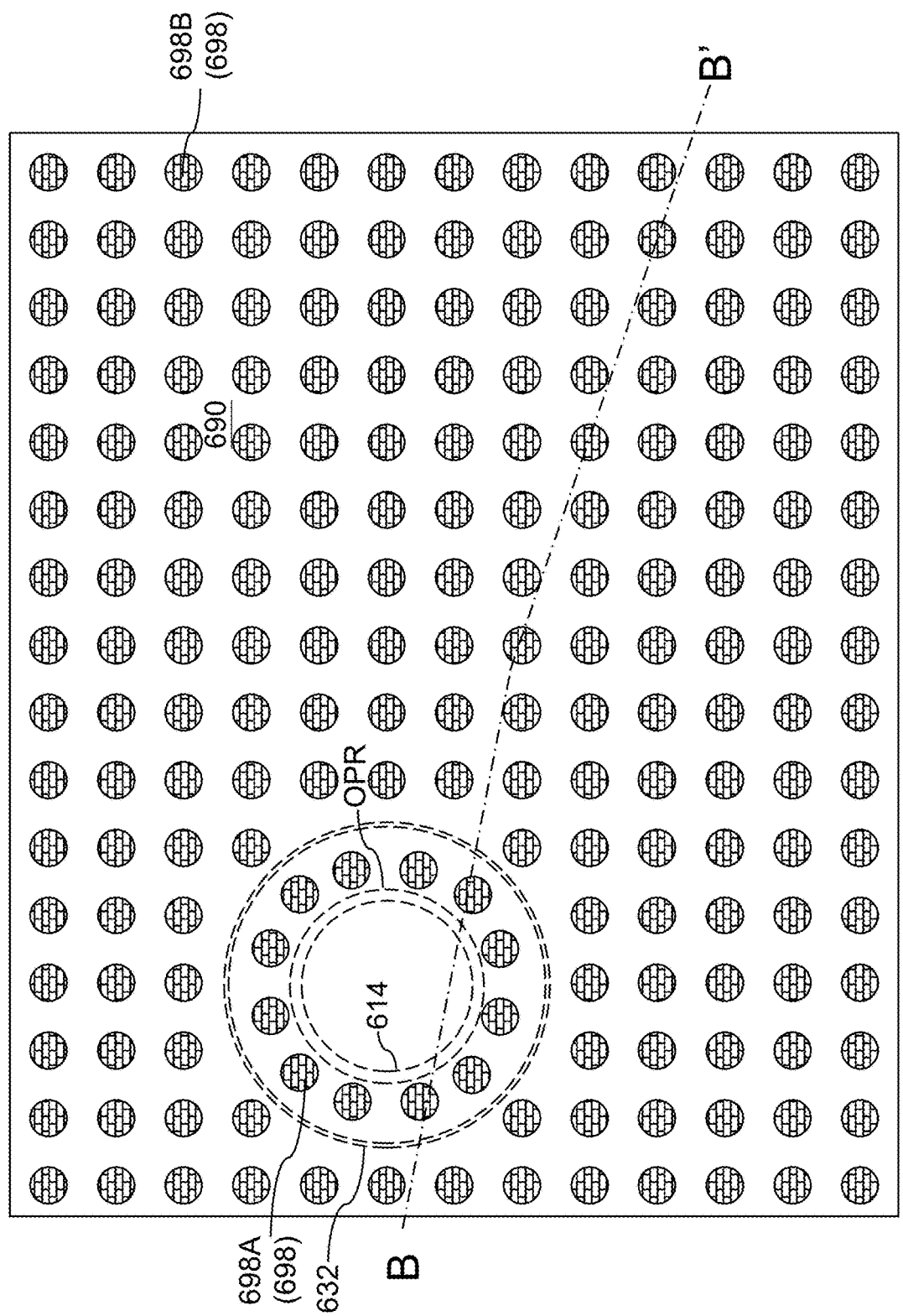
FIG. 7C is a top-down view of an alternative configuration of the first intermediate embodiment structure of FIG. 7A. The hinged vertical plane A-A' is the cut plane of the vertical cross-sectional view of FIG. 7A.

Referring to FIGS. 7A, 7B, and 7C, at least one metallic fill material may be deposited in the pad cavities 697 and via cavity portions 695 and subsequently planarized to form first metal bonding pads 698 and first bonding vias 696. For example, a metallic barrier liner and/or a metallic adhesion liner may be deposited by physical vapor deposition or chemical vapor deposition, and a metallic seed layer may be subsequently deposited by physical vapor deposition. The metallic barrier liner and/or the metallic adhesion liner may comprise a metallic barrier material such as TiN, TaN, WN, MoN, Ti, Ta, etc. Other suitable metallic materials are within the contemplated scope of disclosure. The metallic seed layer may comprise copper. Subsequently, a metallic fill material that may be used for metal-to-metal bonding may be deposited in the remaining volumes of the pad cavities 697 and via cavity portions 695. In an illustrative example, an electroplating process may be performed to deposit a metallic fill material such as copper in remaining volumes of the pad cavities 697 and via cavity portions 695. A planarization process, such as a chemical mechanical polishing process, may be performed to remove portions of the at least one metallic fill material from above the horizontal plane including the top surface of the first bonding-level dielectric layer 690. Remaining portions of the at least one metallic fill material comprise the first metal bonding pads 698.

The first metal bonding pads 698 may comprise first-type metal bonding pads 698A and second-type metal bonding pads 698B. The first-type metal bonding pads 698A fill the pad-level cavities 697A, and the second-type metal bonding pads 698B fill the integrated pad-and-via cavities 697B. The first-type metal bonding pads 698A are collectively referred as a first subset 698A of the first metal bonding pads, and the second-type metal bonding pads 698B are collectively referred to as a second subset 698B of the first metal bonding pads 698.

According to an aspect of the present disclosure, the first subset 698A of the first metal bonding pads 698 has an areal overlap with the dielectric pillar structure 634 in a plan view (such as a top-down view of FIG. 7B), and the second subset 698B of the first metal bonding pads 698 is formed outside an area of the dielectric pillar structure 634 in the plan view. In other words, the first subset 698A of the first metal bonding pads 698 is formed with an areal overlap with the dielectric pillar structure 634 in the plan view. In one embodiment, the entirely of the first subset 698A of the first metal bonding pads 698 is located within the area defined by an inner sidewall of a vertically-extending portion of the dielectric protection liner 632 that vertically extends through the first dielectric material layers 660 in the plan view. In one embodiment, the first subset 698A of the first metal bonding pads 698 does not have any areal overlap with the vertically-extending portion of the dielectric protection liner 632. Thus, the first subset 698A of the first metal bonding pads 698 is not in direct contact with the horizontally-extending portion of the dielectric protection liner 632, and does not contact any other portion of the dielectric protection liner 632.

Each first metal bonding pad 698 within the second subset 698B of the first metal bonding pads 698 does not have any areal overlap with the dielectric pillar structure 634 in the plan view. The second subset 698B of the first metal bonding pads 698 may be formed entirely outside the area of the via cavity 631. In one embodiment, the second subset 698B of the first metal bonding pads 698 may be in contact with the horizontally-extending portion of the dielectric protection liner 632.

With reference to FIGS. 7B and 7C, an optical path region (OPR) that is free of any of the first metal bonding pads 698 is formed over a center portion of the dielectric pillar structure 634. In one embodiment, the radius of the optical path region (OPR) is greater than a nearest neighbor distance selected from the second subset 698B of the first metal bonding pads 698. In one embodiment, the optical path region OPR has an areal overlap with the semiconductor lens 614 in the plan view. In one embodiment, the entire area of the semiconductor lens 614 may be located within the area of the optical path region OPR. Generally, the first metal bonding pads 698 may have rectangular shapes in the plan view as illustrated in FIG. 7B, may have circular shapes in the plan view as illustrated in FIG. 7C, or may have other two-dimensional closed shapes in the plan view.

In one embodiment, each first metal bonding pad 698 within the first subset 698A of the first metal bonding pads 698 has a first thickness t1 that is greater than the thickness of the first bonding-level dielectric layer 690, and comprises a respective portion that protrudes into the dielectric pillar structure 634. The depth of protrusion may be in a range from 100 nm to 1,000 nm, although lesser and greater protrusion depths may also be used. Each first metal bonding pad 698 within the second subset 698B of the first metal bonding pads 698 comprises a pad portion having a second thickness t2 that is less than the first thickness t1 and a via portion that extends through the dielectric protection liner 632. In one embodiment, the second thickness t2 may be the same as the thickness of the first bonding-level dielectric layer 690.

Figure 8:
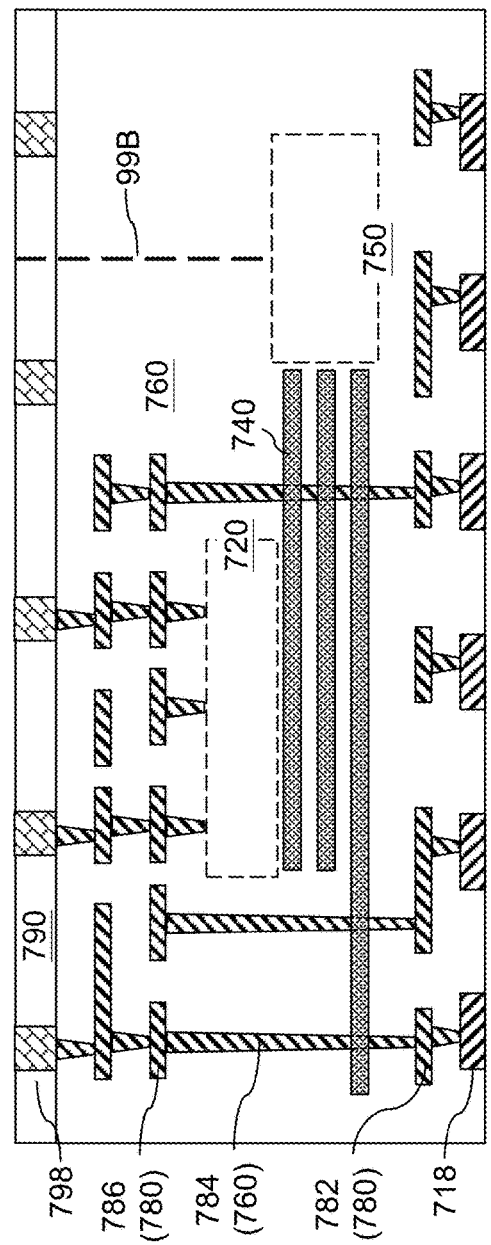
FIG. 8 is a vertical cross-sectional view of a photonic integrated circuits (PIC) die according to the first embodiment of the present disclosure.

An electronic integrated circuits (EIC) die 600 is formed in each unit area of the first embodiment structure, within which each semiconductor substrate 610 in a unit area is a portion of a semiconductor wafer. A two-dimensional periodic array of EIC dies 600 may be formed. Each EIC die 600 comprises a semiconductor substrate 610, a semiconductor lens 614 which comprises a portion of the semiconductor substrate 610 and has a convex semiconductor surface; semiconductor devices 620 located on a horizontal surface of the semiconductor substrate 610, first dielectric material layers 660 embedding first metal interconnect structures 680, a dielectric pillar structure 634 vertically extending through each layer selected from the first dielectric material layers 660 and having an areal overlap with the semiconductor lens 614 in a plan view; and a first bonding-level dielectric layer 690 embedding first metal bonding pads 698. A first subset 698A of the first metal bonding pads 698 has an areal overlap with the dielectric pillar structure 634 in the plan view;

Referring to FIG. 8, a photonic integrated circuits (PIC) die 700 is illustrated. In some embodiments, a two-dimensional periodic array of PIC dies 700 may be provided on a carrier wafer (not illustrated). In this embodiment, the PIC die 700 illustrated in FIG. 8 may be located within a unit area within the two-dimensional periodic array of PIC dies 700. The two-dimensional periodic array of PIC dies 700 may have the same periodicity as the two-dimensional array of EIC dies 600 described above.

The PIC die 700 may comprise various types of photonic devices 720 known in the art; an optical deflector 750 configured to change the direction of an optical beam between a vertical direction along a second optical path 99B and a horizontal direction; waveguides 740 providing optical paths to and from optical nodes of the various photonic devices 720 and including a horizontal beam path for optical beams impinging on, or emanating from, the optical deflector 750; and second metal interconnect structures 780 configured to provide electrical signals to the various electrical nodes of the photonic devices 720. The photonic devices 720 may comprise optical switches, optical memory devices, and/or other devices that may generate, modify, and/or receive optical signals.

The optical deflector 750 comprises a device that may change the propagation direction of an optical beam from a horizontal direction to a vertical direction, or vice versa. The optical deflector 750 may be located adjacent to a subset of the waveguides 740, and may be configured to change light propagation direction between a horizontal direction passing through a subset of the waveguides 740 and vertical direction passing through the second dielectric material layers 760. In one embodiment, the optical deflector 750 may comprise an in-die mirror having a tilt angle of 45 degrees relative to a vertical direction. The in-die mirror may comprise a reflective layer stack configured to maximize reflection at a 45 degree incidence angle. In another embodiment, the optical deflector 750 may comprise a grating coupler having an end that is optically connected to at least one of the waveguides 740, for example, by evanescent coupling. In one embodiment, the grating coupler comprises an optical grating having a periodicity along a horizontal direction, and may have a periodic pattern of alternating transparent and opaque sections. The periodicity of the periodic pattern is selected to maximize optical coupling at the wavelength of the light to be used for photonic signal transmission. As light encounters the grating of the grating coupler from a vertical direction, the light undergoes scattering. The dimensions of the grating may be selected such that the light constructively interferes only along the direction of a waveguide 740. The same principle applies for the light exiting the waveguide 740 and impinging the grating coupler, and causes constructive interference only along the vertical direction, which is the exit direction of the light.

The waveguides 740 comprises a high-refractive-index material that may confine photons therein. For example, the waveguides 740 may comprise silicon nitride or silicon. The lateral dimensions and the thicknesses of the waveguides 740 may be selected to maximize the total internal reflection.

The second metal interconnect structures 780 may be formed in second dielectric material layers 760. The second metal interconnect structures 780 may comprise substrate-side metal interconnect structures 782 located on one side of the waveguides 740, EIC-die-side metal interconnect structures 786 located on an opposite side of the waveguides 740, and interconnection via structures 784 vertically extending through the levels of the photonic devices 720 and the waveguides 740, and providing electrical connection between the substrate-side metal interconnect structures 782 and the EIC-die-side metal interconnect structures 786.

A second bonding-level dielectric layer 790 having formed therein second metal bonding pads 798 may be formed on the side of the EIC-die-side metal interconnect structures 786. The second metal bonding pads 798 are electrically connected to the EIC-die-side metal interconnect structures 786, and may be arranged in a pattern that is a mirror image pattern of the pattern of the first metal bonding pads 698 of an EIC die 600. Substrate-side bonding pads 718 may be provided such that the substrate-side bonding pads 718 are electrically connected to the substrate-side metal interconnect structures 782, and have physically exposed bonding surfaces. The pattern of the substrate-side bonding pads 718 may be a mirror image pattern of bonding pads provided on a packaging substrate to which the PIC die may be subsequently bonded.

Figure 9:
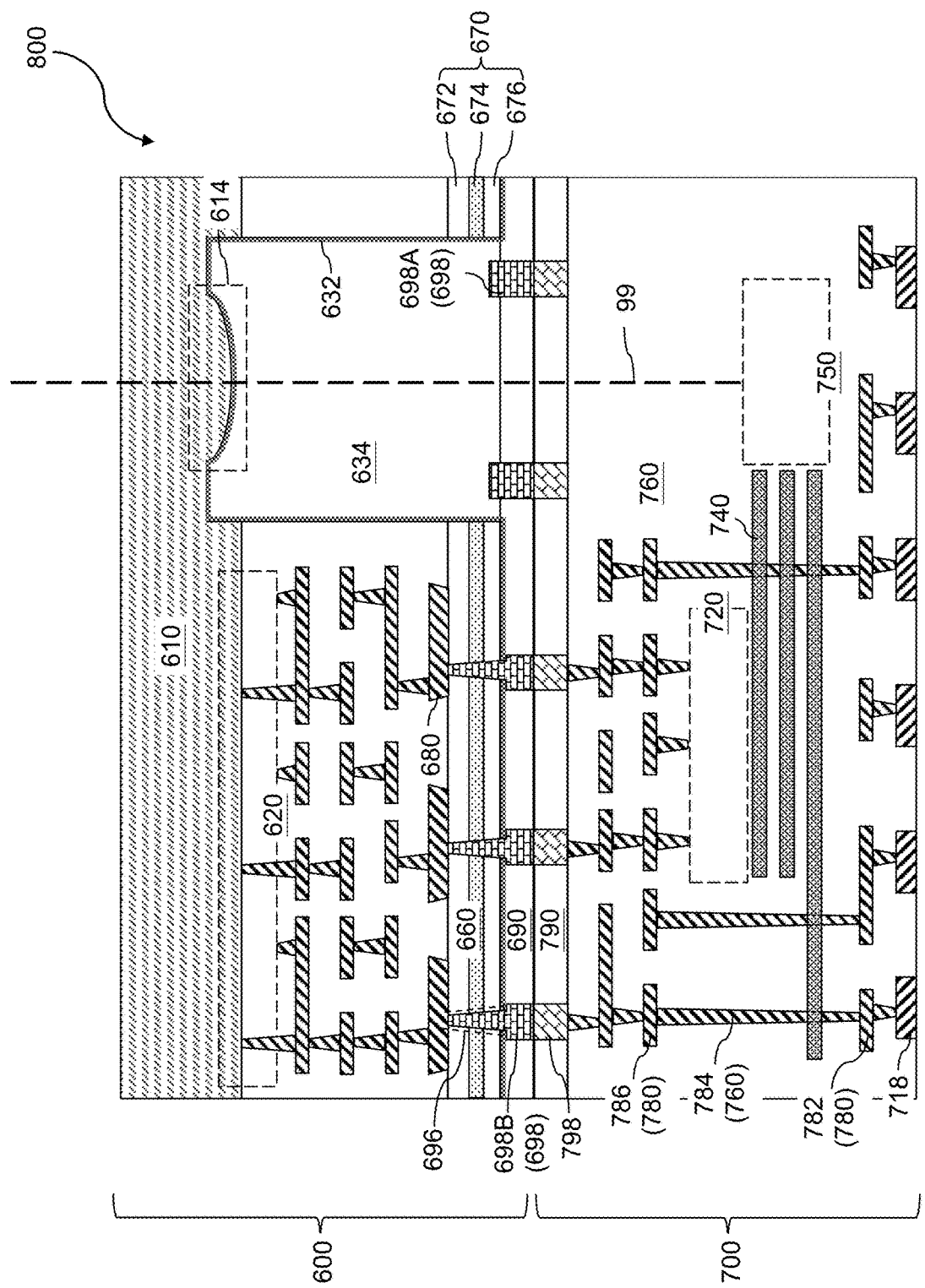
FIG. 9 is a vertical cross-sectional structure of the first intermediate embodiment structure after formation of a composite die including a bonded assembly of the PIC die and the EIC die according to the first embodiment of the present disclosure.

Referring to FIG. 9, the PIC die 700 of FIG. 8 may be bonded to the EIC die 600 of FIG. 7 to form a composite die 800. In embodiments in which the PIC die 700 is provided within a two-dimensional array of PIC dies 700 and wherein the EIC die 600 is provided within a two-dimensional array of EIC dies 600, a wafer-to-wafer bonding may be performed to bond the two-dimensional array of PIC dies 700 to the two-dimensional array of EIC dies 600. A carrier wafer (if used) for the two-dimensional array of PIC dies 700 may be subsequently detached. Each composite die 800 includes a bonded assembly of the PIC die 700 and the EIC die 600. Each PIC die 700 may be attached to a respective EIC die 600 by bonding the second metal bonding pads 798 to the first metal bonding pads 698 by metal-to-metal bonding, such as copper-to-copper bonding. The second metal bonding pads 798 are in direct contact with the first metal bonding pads 698 after metal-to-metal bonding.

In one embodiment, the PIC die 700 and the EIC die 600 may be brought into contact with each other such that each second metal bonding pad 798 contacts a respective first metal bonding pad 698. An anneal process may be performed at an elevated temperature while the EIC die 600 and the PIC die 700 are pressed against each other. In such an anneal process, metal grains in the first metal bonding pads 698 and the second metal bonding pads 798 may grow in average size such that a subset of the grain boundaries grow across the horizontal plane at which the first metal bonding pads 698 and the second metal bonding pads 798 contact. Each mating pair of a first metal bonding pad 698 and a second metal bonding pad 798 forms a contiguous set of metal grains that provide adhesion strength to one another to provide metal-to-metal bonding between the first metal bonding pads 698 and the second metal bonding pads 798. In one embodiment, the first metal bonding pads 698 and the second metal bonding pads 798 may comprise copper pads, and the metal-to-metal bonding may be copper-to-copper bonding.

Further, a surface of the second bonding-level dielectric layer 790 may be bonded to a surface of the first bonding-level dielectric layer 690 by dielectric-to-dielectric bonding such that the PIC die 700 is bonded to the EIC die 600 by hybrid bonding. The elevated temperature may be in a range from 200 degrees Celsius to 400 degrees Celsius, although lower and higher temperatures may also be used. The duration of the anneal process at the elevated temperature may be in a range from 30 minutes to 360 minutes, although lesser and greater durations may also be used.

Generally, the second metal bonding pads 798 may be bonded to the first metal bonding pads 698 by metal-to-metal bonding in which the second metal bonding pads 798 are in direct contact with the first metal bonding pads 698. The PIC die 700 and the EIC die 600 may be aligned to each other such that light impinging on, or emanating from, the optical deflector 750 passes through the dielectric pillar structure 634 and the semiconductor lens 614 and a portion of the semiconductor substrate 610 having an areal overlap with the dielectric pillar structure 634 in the plan view. A vertical optical path 99 may be formed between the optical deflector 750 and a physically exposed distal surface of the semiconductor substrate 610.

The semiconductor substrate 610 may be optionally thinned to an optical thickness, for example, by grinding, polishing, an anisotropic etch process, and/or an isotropic etch process. The thickness of the semiconductor substrate 610 after thinning may be in a range from 5 microns to 300 microns, although lesser and greater thicknesses may also be used.

Figure 10:
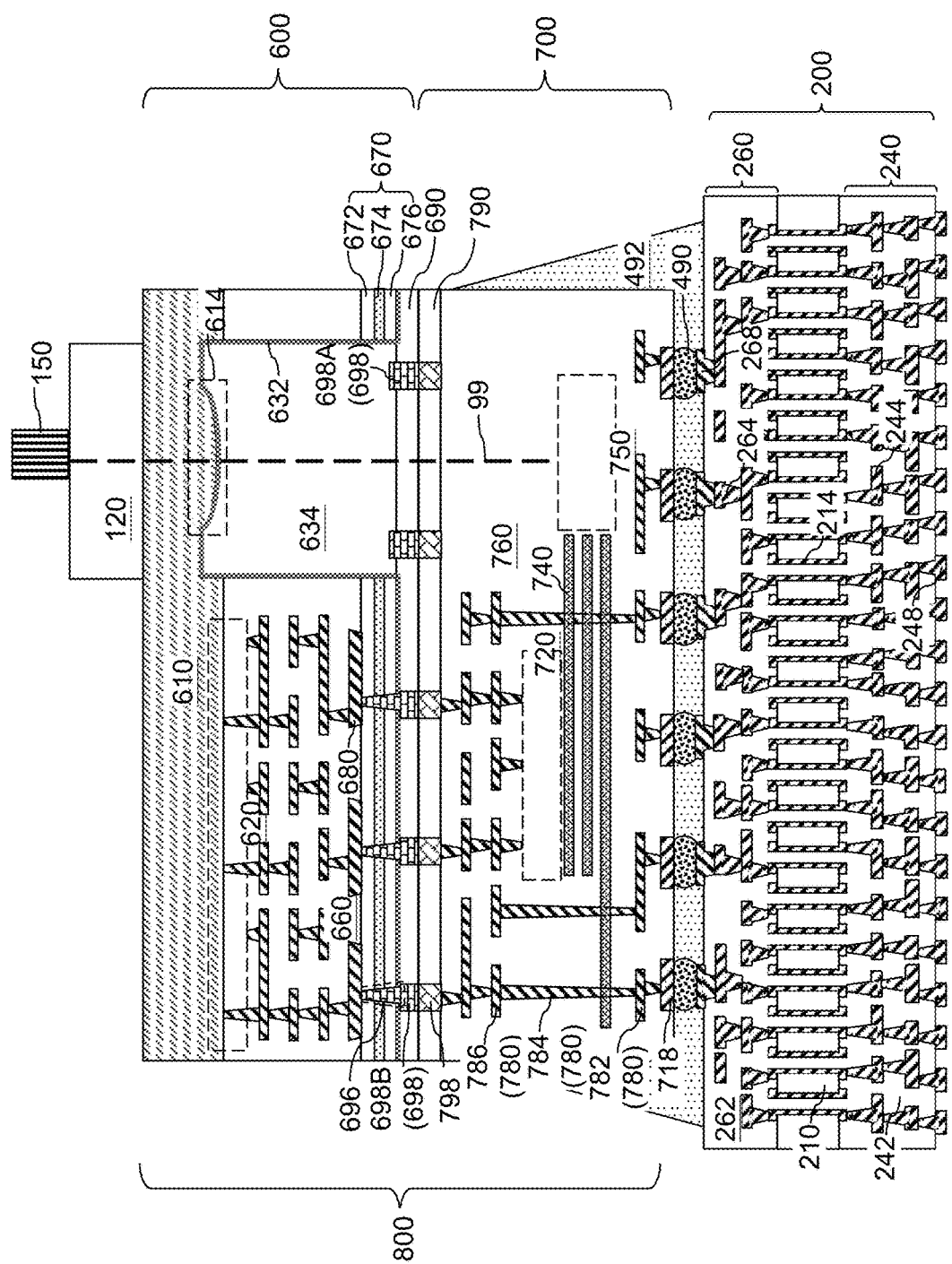
FIG. 10 is a vertical cross-sectional view of the first intermediate embodiment structure after attaching a fiber access unit and a packaging substrate to the composite die according to the first embodiment of the present disclosure.

Referring to FIG. 10, the composite die 800 may be bonded to a packaging substrate 200. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layer, dielectric interlayers, and/or at least one embedded interposer (such as a silicon interposer). Such a system-integrated packaging substrate may include layer-to-layer interconnections using substrate-side solder material portions, microbumps, underfill material portions (such as molded underfill material portions), and/or an adhesion film. While the present disclosure is described using a cored packaging substrate, it is understood that the scope of the present disclosure is not limited by any particular type of substrate package. For example, a SoIS may be used in lieu of a cored packaging substrate. In embodiments in which a SoIS is used, the core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners (not illustrated)

may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 having formed therein board-side wiring interconnects 244. The chip-side SLC 260 may include chip-side insulating layers 262 having formed therein chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the chip-side surface laminar circuit 260 comprises chip-side wiring interconnects 264 that are connected to an array of substrate bonding pads 268. The array of substrate bonding pads 268 may be configured to allow bonding through C4 solder balls. The board-side surface laminar circuit 240 comprises board-side wiring interconnects 244 that are connected to an array of board-side bonding pads 248. The array of board-side bonding pads 248 is configured to allow bonding through solder joints having a greater dimension than the C4 solder balls. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

In one embodiment, the packaging substrate 200 comprises a first horizontal surface configured to face the composite die 800. The first horizontal surface is the surface that faces the substrate-facing horizontal surface of the composite die 800 during a subsequent assembly process. The packaging substrate 200 further comprises a second horizontal surface located on an opposite side of the first horizontal surface. The substrate bonding pads 268 of the packaging substrate 200 may be located on the first horizontal surface of the packaging substrate 200, and may have a mirror image pattern of the pattern of the substrate-side bonding pads 718.

Specifically, each of the solder material portions 490 may be bonded to a respective one of the substrate bonding pads 268 and to a respective one of the substrate-side bonding pads 718. A reflow process may be performed to reflow the solder material portions 490 such that each solder material portion 490 is bonded to a respective one of the substrate bonding pads 268 and to a respective one of the substrate-side bonding pads 718.

An underfill material may be applied into a gap between the composite die 800 and the packaging substrate 200. The underfill material may comprise any underfill material known in the art. An underfill material portion may be formed around the array of substrate-side bonding pads 718, the array of substrate bonding pads 268, and the array of solder material portions 490 in the gap between the composite die 800 and the packaging substrate 200. This underfill material portion is formed between the composite die 800 and the packaging substrate 200, and thus, is herein referred to as a die-package underfill material portion 492, or as a DP underfill material portion 492.

A fiber access unit 120 may be attached to a top surface of the semiconductor substrate 610, for example, using an optical glue (not expressly shown). As used herein, a fiber access unit (FAU) 120 refers to any external device that may optically couple optical fibers 150 to an optical path such as the vertical optical path 99.

Figure 11:
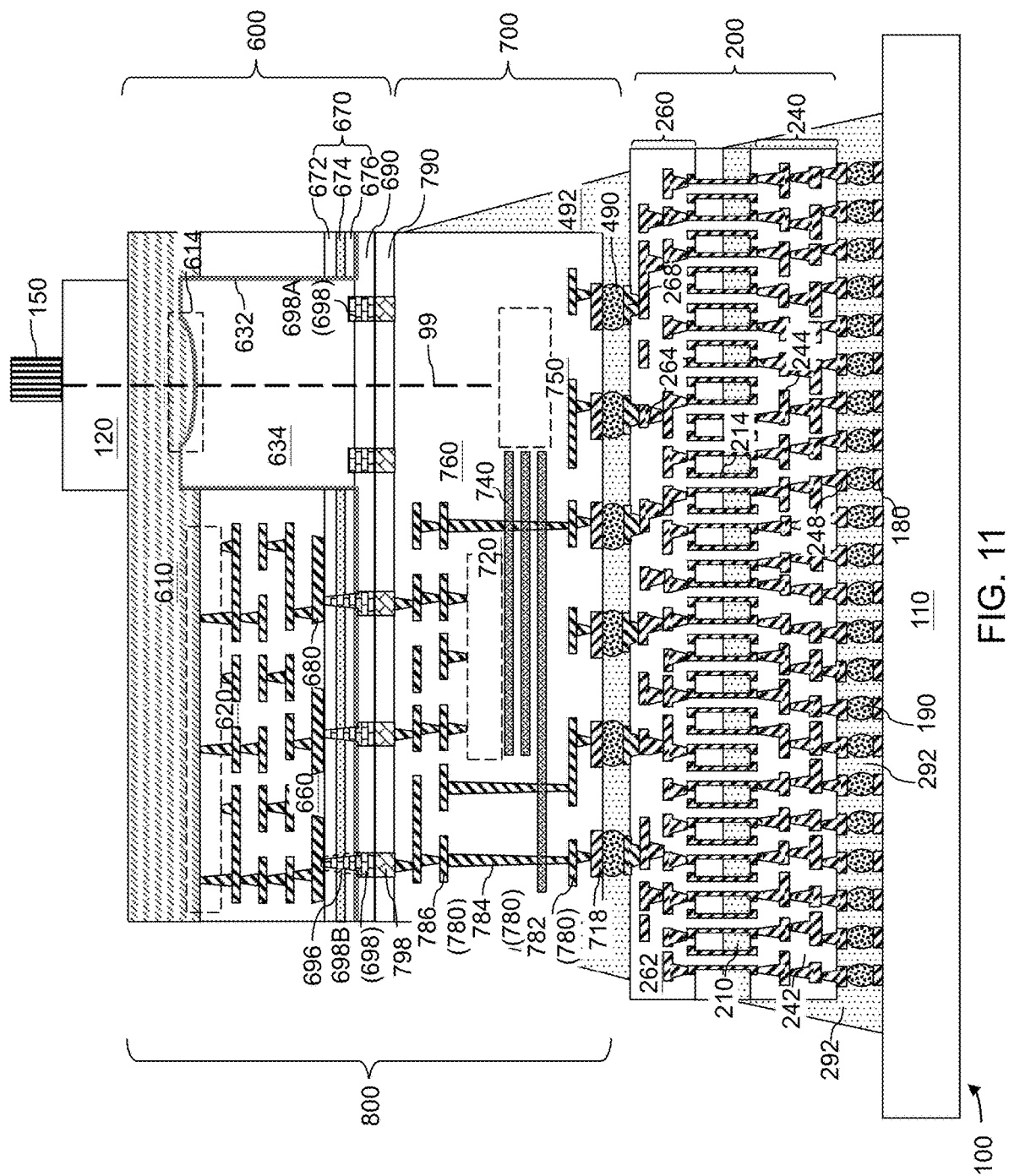
FIG. 11 is a vertical cross-sectional view of the first intermediate embodiment structure after attaching the packaging substrate to a printed circuit board according to the first embodiment of the present disclosure.

Referring to FIG. 11, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An additional underfill material portion, which is herein referred to as a board-substrate underfill material portion 292 or a BS underfill material portion 292, may be formed around the solder joints 190 by applying and shaping an underfill material. The packaging substrate 200 is attached to the PCB 100 through the array of solder joints 190.

Figure 12:
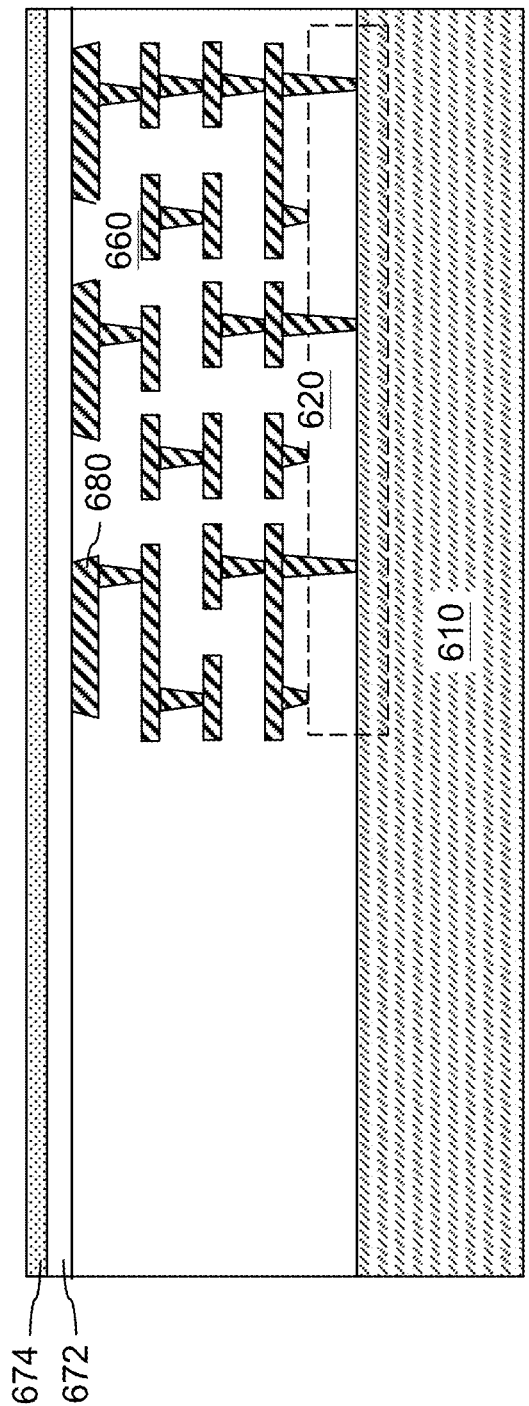
FIG. 12 is a vertical cross-sectional view of a second intermediate embodiment structure for forming an electronic integrated circuits (EIC) die after formation of lower passivation-level dielectric layers according to a second embodiment of the present disclosure.

Referring to FIG. 12, a second embodiment structure for forming an electronic integrated circuits (EIC) die according to a second intermediate embodiment of the present disclosure is illustrated. The second embodiment structure may be derived from the first intermediate embodiment structure illustrated in FIG. 1 by omitting formation of the third passivation-level dielectric layer 676. The first passivation-level dielectric layer 672 and the second passivation-level dielectric layer 674 are collectively referred to as lower passivation-level dielectric layers (672, 674).

Figure 13A:
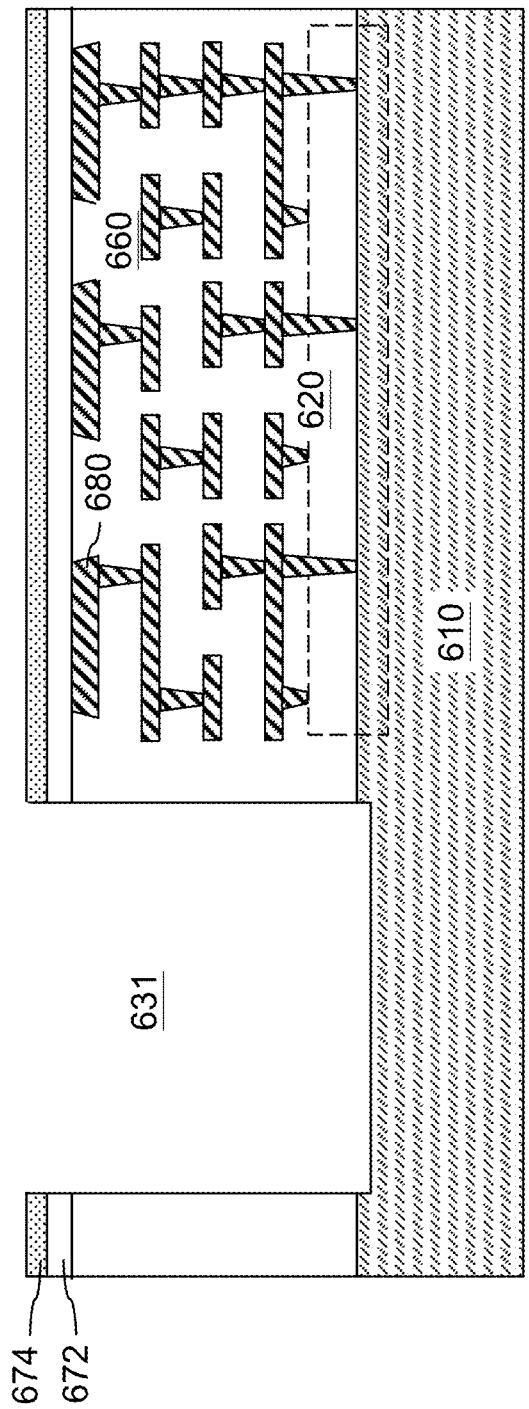
FIG. 13A is a vertical cross-sectional view of the second intermediate embodiment structure after formation of a via cavity according to the second embodiment of the present disclosure.
Figure 13B:
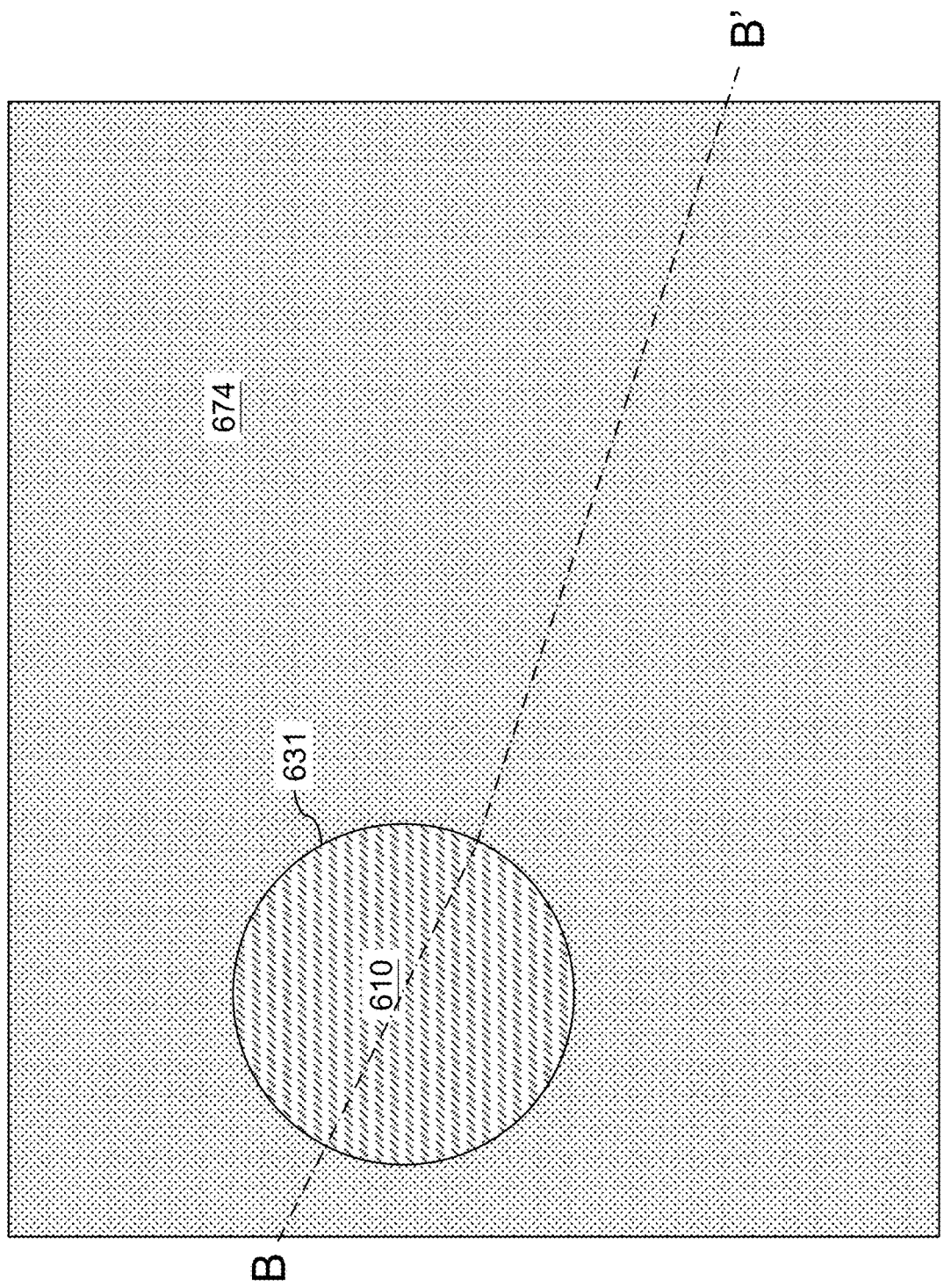
FIG. 13B is a top-down view of the second intermediate embodiment structure of FIG. 13A. The hinged vertical plane A-A' is the cut plane of the vertical cross-sectional view of FIG. 13A.

Referring to FIGS. 13A and 13B, the processing steps described with reference to FIGS. 2A and 2B may be performed to form a via cavity 631 through the passivation-level dielectric layers 670 and the first dielectric material layers 660 and into an upper portion of the semiconductor substrate 610. The via cavity 631 may have a circular or substantially circular horizontal cross-sectional area. The via cavity 631 may have a cylindrical vertically-extending straight sidewall that extends from the semiconductor substrate 610 to a topmost surface of the passivation-level dielectric layers 670. A recessed horizontal surface and a cylindrical vertically-extending surface of the semiconductor substrate 610 may be physically exposed in the bottom portion of the via cavity 631. Generally, the via cavity 631 may have the same structural characteristics as in the first intermediate embodiment structure except that the third passivation-level dielectric layer 676 is not present in the second intermediate embodiment structure at this processing step.

Figure 14:
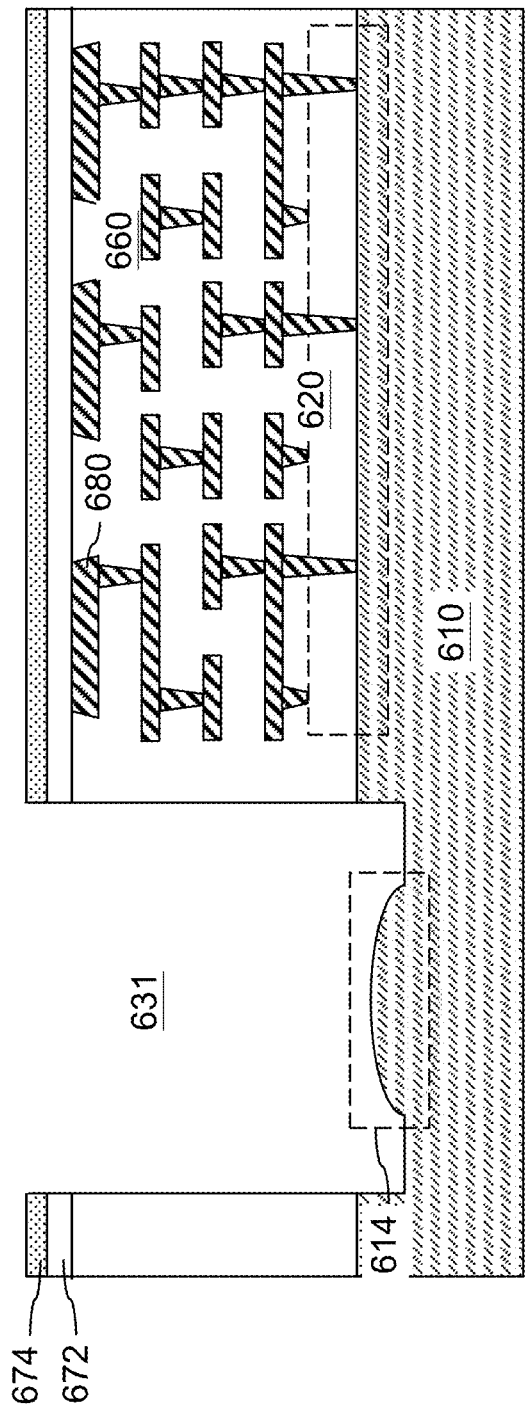
FIG. 14 is a vertical cross-sectional view of the second intermediate embodiment structure after formation of a semiconductor lens according to the second embodiment of the present disclosure.

Referring to FIG. 14, the processing steps described with reference to FIG. 3 may be performed to form a semiconductor lens 614 underneath the via cavity 631. The semiconductor lens 614 may have the same structural characteristics as in the first embodiment structure.

Figure 15:
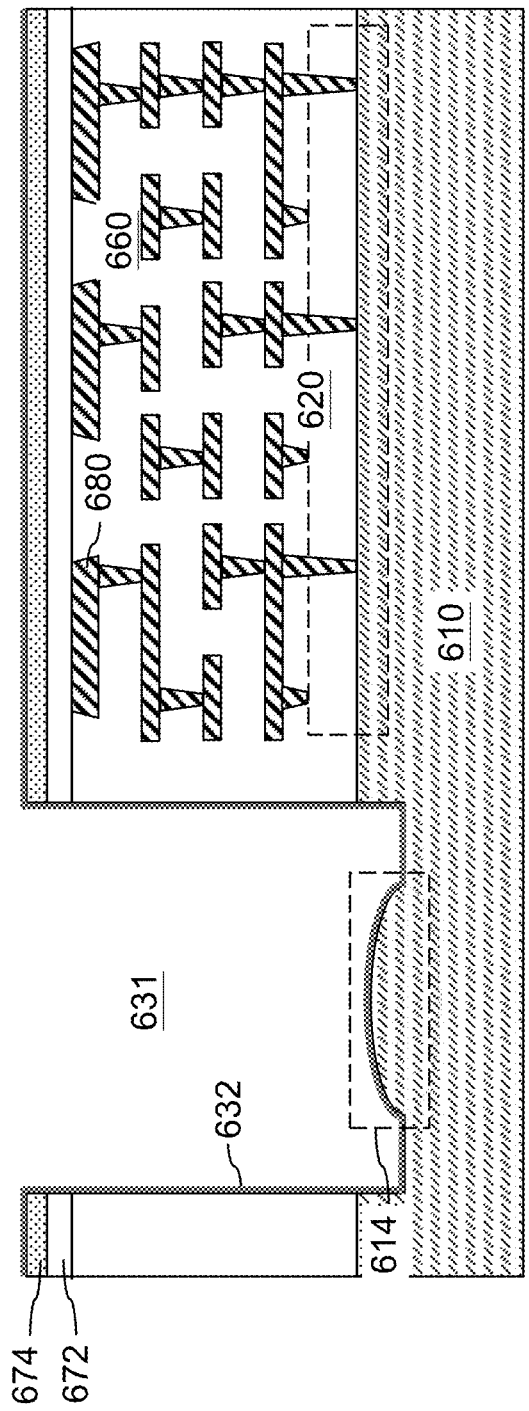
FIG. 15 is a vertical cross-sectional view of the second intermediate embodiment structure after formation of a dielectric protection liner according to the second embodiment of the present disclosure.

Referring to FIG. 15, the processing steps described with reference to FIG. 4 may be performed to form a dielectric protection liner 632. The dielectric protection liner 632 contacts each of the first dielectric material layers 660, the convex semiconductor surface of the semiconductor lens 614, and a vertically-extending sidewall of the semiconductor substrate 610. The dielectric protection liner 632 comprises a cylindrical vertically-extending portion that contacts each of the first dielectric material layers 660 and the vertically-extending sidewall of the semiconductor substrate 610, and further comprises a horizontally-extending portion that contacts the top surface of the topmost layer of the passivation-level dielectric layers 670. The dielectric protection liner 632 comprises a contoured bottom portion having a concave bottom surface that contacts the convex top surface of the semiconductor lens 614. The thickness of the dielectric protection liner 632 may be selected to minimize reflection at the interface with the semiconductor lens 614 by avoiding constructive interference of reflected components of light generated at the top surface and at the bottom surface of the contoured portion of the dielectric protection liner 632. One of more passivation-level dielectric layer (672, 674) of the passivation-level dielectric layers 670 is located between the first dielectric material layers 660 and a horizontally-extending portion of the dielectric protection liner 632.

Figure 16:
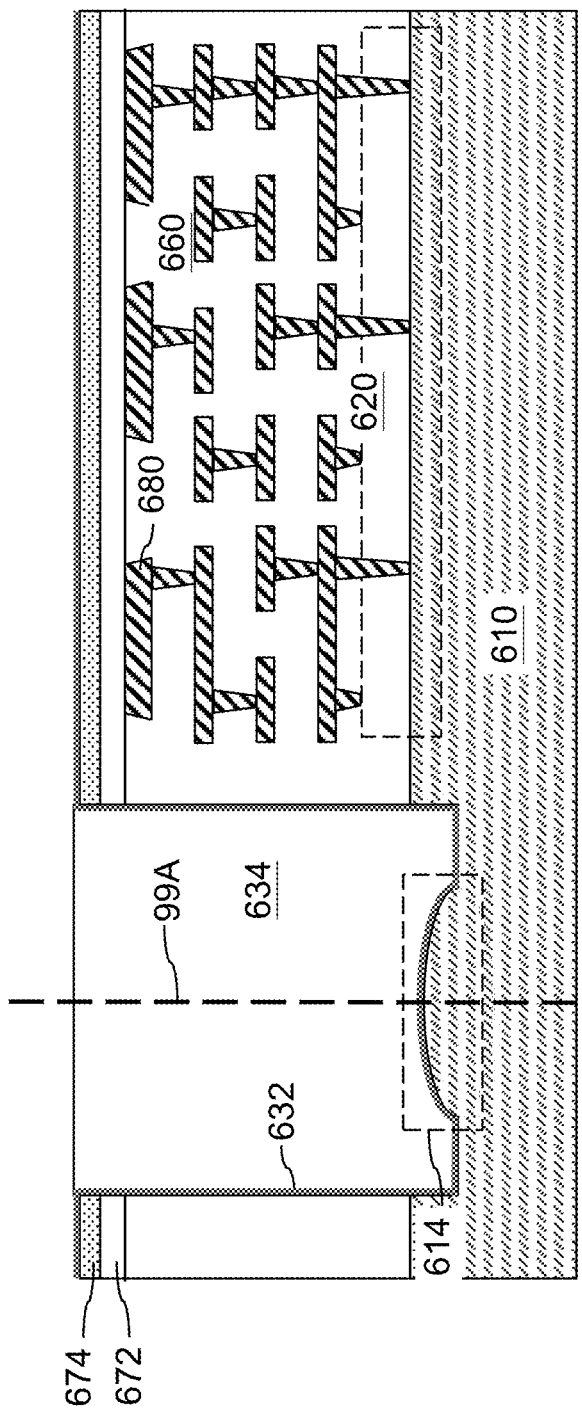
FIG. 16 is a vertical cross-sectional view of the second intermediate embodiment structure after formation of a dielectric pillar structure in the via cavity according to the second embodiment of the present disclosure.

Referring to FIG. 16, the processing steps described with reference to FIG. 5 may be performed to form a dielectric pillar structure 634 in the via cavity 631. The top surface of the dielectric pillar structure 634 may be located within the horizontal plane including the top surface of the horizontally-extending portion of the dielectric protection liner 632. A first optical path 99A is formed through a center portion of the dielectric pillar structure 634, the semiconductor lens 614, and an underlying portion of the semiconductor substrate 610.

Figure 17A:
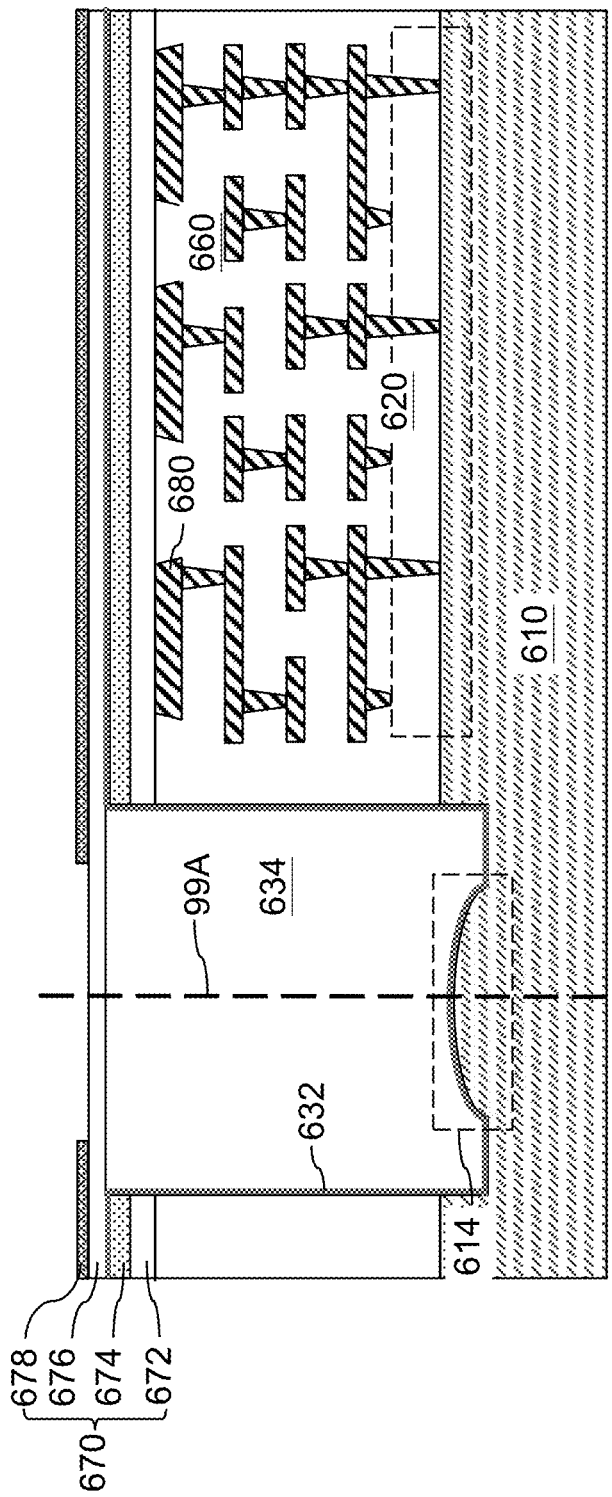
FIG. 17A is a vertical cross-sectional view of the second intermediate embodiment structure after formation of upper passivation-level dielectric layers according to the second embodiment of the present disclosure.
Figure 17B:
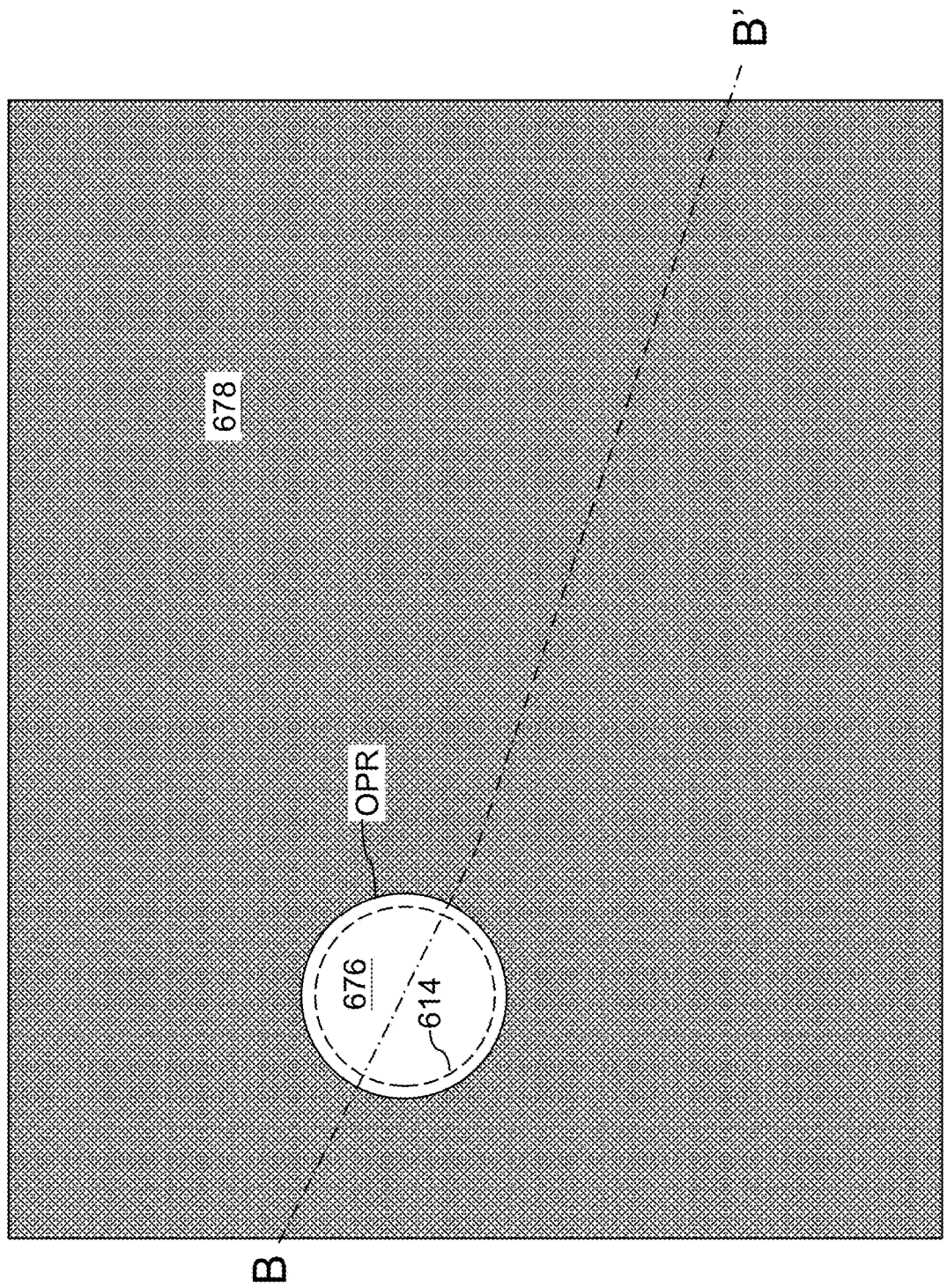
FIG. 17B is a top-down view of the second intermediate embodiment structure of FIG. 17A. The hinged vertical plane A-A' is the cut plane of the vertical cross-sectional view of FIG. 17A.

Referring to FIGS. 17A and 17B, a third passivation-level dielectric layer 676 and an etch-stop dielectric layer 678 may be formed over the dielectric protection liner 632 and the dielectric pillar structure 634. The third passivation-level dielectric layer 676 may have the same material composition and the same thickness as in the first embodiment structure. The etch-stop dielectric layer 678 comprises a dielectric material that may provide a higher etch resistance than the dielectric material of a second bonding-level dielectric layer to be subsequently formed. The etch-stop dielectric layer 678 may comprise silicon nitride, silicon oxynitride, silicon carbide nitride, a dielectric metal oxide, or combinations thereof. The thickness of the etch-stop dielectric layer 678 may be in a range from 10 nm to 1000 nm, although lesser and greater thicknesses may also be used. The third passivation-level dielectric layer 676 and the etch-stop dielectric layer 678 are herein referred to as upper passivation-level dielectric layers 676. The first passivation-level dielectric layer 672, the second passivation-level dielectric layer 674, the third passivation-level dielectric layer 676, and the etch-stop dielectric layer 678 are collectively referred to as passivation-level dielectric layers 670.

A photoresist layer (not shown) may be applied over the etch-stop dielectric layer 678, and may be lithographically patterned to form an opening in the optical path region OPR. An anisotropic etch process may be performed to remove a portion of the etch-stop dielectric layer 678 that underlies the opening in the photoresist layer. The opening in the etch-stop dielectric layer 678 defines the area of the optical path region OPR. The photoresist layer is subsequently removed, for example, by ashing. In one embodiment, the optical path region OPR has an areal overlap with the semiconductor lens 614 in the plan view. In one embodiment, the entire area of the semiconductor lens 614 may be located within the area of the optical path region OPR.

Figure 18:
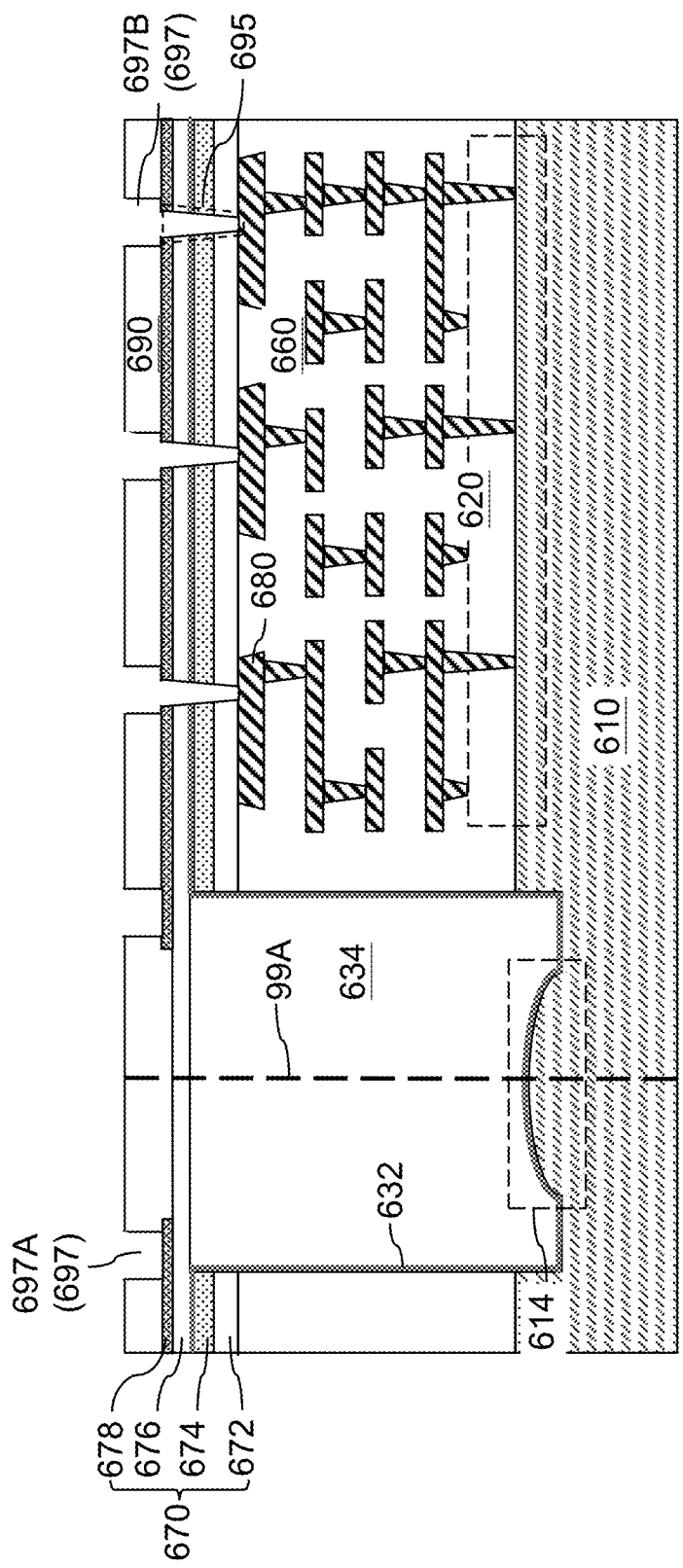
FIG. 18 is a vertical cross-sectional view of the second intermediate embodiment structure after formation of a first bonding-level dielectric layer, pad cavities, and integrated pad-and-via cavities according to the second embodiment of the present disclosure.

Referring to FIG. 18, a dielectric material may be deposited over the etch-stop dielectric layer 678 to form a first bonding-level dielectric layer 690. The dielectric material comprises a material that may be used to dielectric-to-dielectric bonding. For example, the dielectric material of the first bonding-level dielectric layer 690 may comprise undoped silicate glass or a doped silicate glass. The thickness of the first bonding-level dielectric layer 690 may be in a range from 10 nm to 5 microns, although lesser and greater thicknesses may also be used. The first bonding-level dielectric layer 690 may be vertically spaced from the horizontally-extending portion of the dielectric protection liner 632 and the dielectric pillar structure 634 by the third passivation-level dielectric layer 676 and the etch-stop dielectric layer 678.

A first photoresist layer (not shown) may be applied over the first bonding-level dielectric layer 690, and may be lithographically patterned to form a pattern of discrete openings that overlie a subset of the first metal interconnect structures 680 that is located at the topmost level of the first metal interconnect structures 680. A first anisotropic etch process may be performed to form discrete via openings through the first bonding-level dielectric layer 690, the etch-stop dielectric layer 678, and optionally into one or more of the third passivation-level dielectric layer 676, a horizontally-extending portion of the dielectric protection liner 632, the second passivation-level dielectric layer 674, and the first passivation-level dielectric layer 672. The first photoresist layer may be removed, for example, by ashing.

A second photoresist layer (not shown) may be applied over the first bonding-level dielectric layer 690, and may be lithographically patterned to form discrete openings having a pattern of bonding pads. According to an aspect of the present disclosure, a first subset of the discrete openings may be formed with an areal overlap with the sidewall of the via cavity 631 (which is now filled with the dielectric pillar structure 634 and portions of the dielectric protection liner 632) in the plan view, i.e., with an areal overlap with the outer sidewall of the vertically-extending portion of the dielectric protection liner 632 in the plan view. Further, a center region of the area defined by the sidewall of the via cavity 631 in the plan view is free of any opening in the second photoresist layer so that the openings in the second photoresist layer do not have any areal overlap with the first optical path 99A. A second subset of the discrete openings may be formed outside the area enclosed by the sidewall of the via cavity 631 in the plan view such that each discrete opening in the second subset encloses an area of a respective via opening through the first bonding-level dielectric layer 690.

A second anisotropic etch process may be performed to transfer the pattern of the openings in the second photoresist layer through the first bonding-level dielectric layer 690. Pad-shaped cavities are formed through the first bonding-level dielectric layer 690 underneath the discrete openings in the second photoresist layer, and the pre-existing via openings through the first bonding-level dielectric layer 690, the etch-stop dielectric layer 678, and optionally through the third passivation-level dielectric layer 676, the dielectric protection liner 632, and the second passivation-level dielectric layer 674 may be vertically extended through the entirety of the passivation-level dielectric layers 670 to a top surface of a respective first metal interconnect structure 680 at the topmost level of the first metal interconnect structures 680.

Pad-level cavities 697A may be formed through the first bonding-level dielectric layer 690 underneath the first subset of the discrete openings in the second photoresist layer, and integrated pad-and-via cavities 697B are formed through the first bonding-level dielectric layer 690 underneath the second subset of the discrete openings in the second photoresist layer. The pad-level cavities 697A and the integrated padand-via cavities 697B are collectively referred to as pad cavities 697. The etch-stop dielectric layer 678 function as an etch-stop structure during the second anisotropic etch process. Thus, each pad cavities 697 comprises a bottom surface which is a physically exposed top surface segment of the etch-stop dielectric layer 678. Each integrated pad-and-via cavity 697B may comprise a pad cavity portion that is formed through the first bonding-level dielectric layer 690, and a via cavity portion 695 that vertically extends through each layer in the passivation-level dielectric layers 670. In one embodiment, the depth of each pad cavity portion may be the same as the thickness of the first bonding-level dielectric layer 690. The second photoresist layer may be removed, for example, by ashing.

While the present disclosure is described using an embodiment in which via openings are formed prior to formation of pad-level cavities using a via-first dual patterning process, embodiments are expressly contemplated herein in which the pad-level cavities are formed prior to formation of the via openings.

Figure 19A:
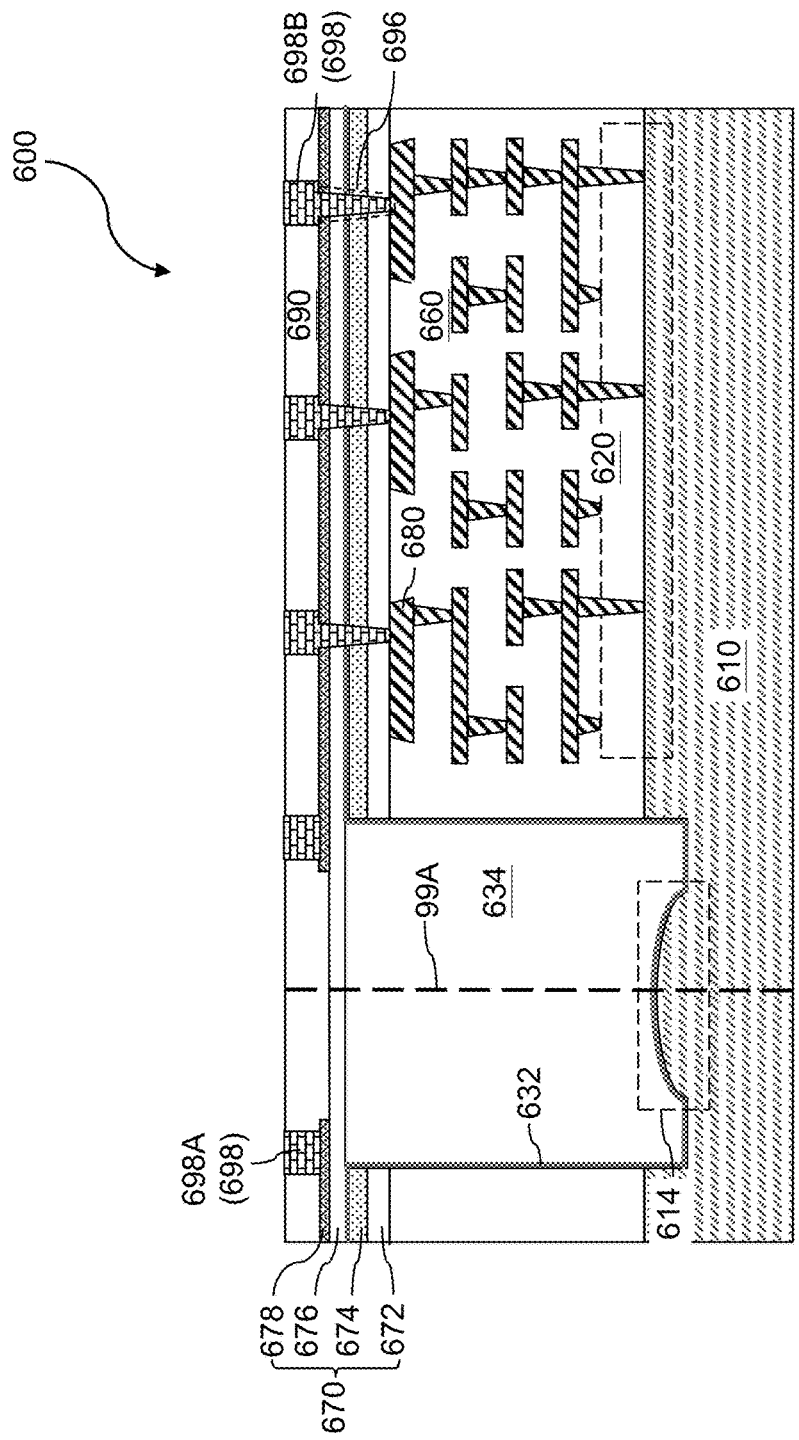
FIG. 19A is a vertical cross-sectional view of the second intermediate embodiment structure after formation of first metal bonding pads according to the second embodiment of the present disclosure.
Figure 19B:
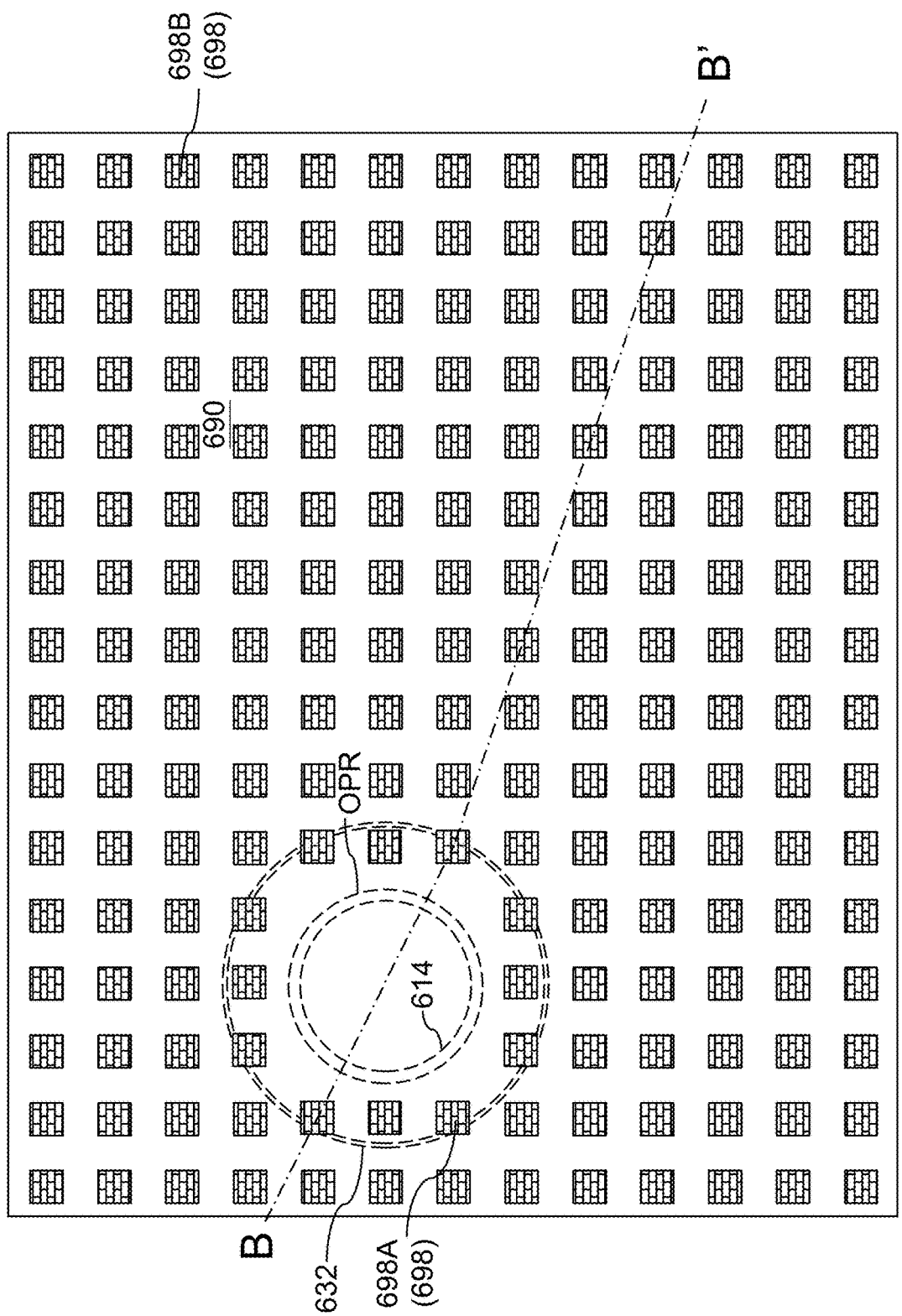
FIG. 19B is a top-down view of the second intermediate embodiment structure of FIG. 19A. The hinged vertical plane A-A' is the cut plane of the vertical cross-sectional view of FIG. 19A.
Figure 19C:
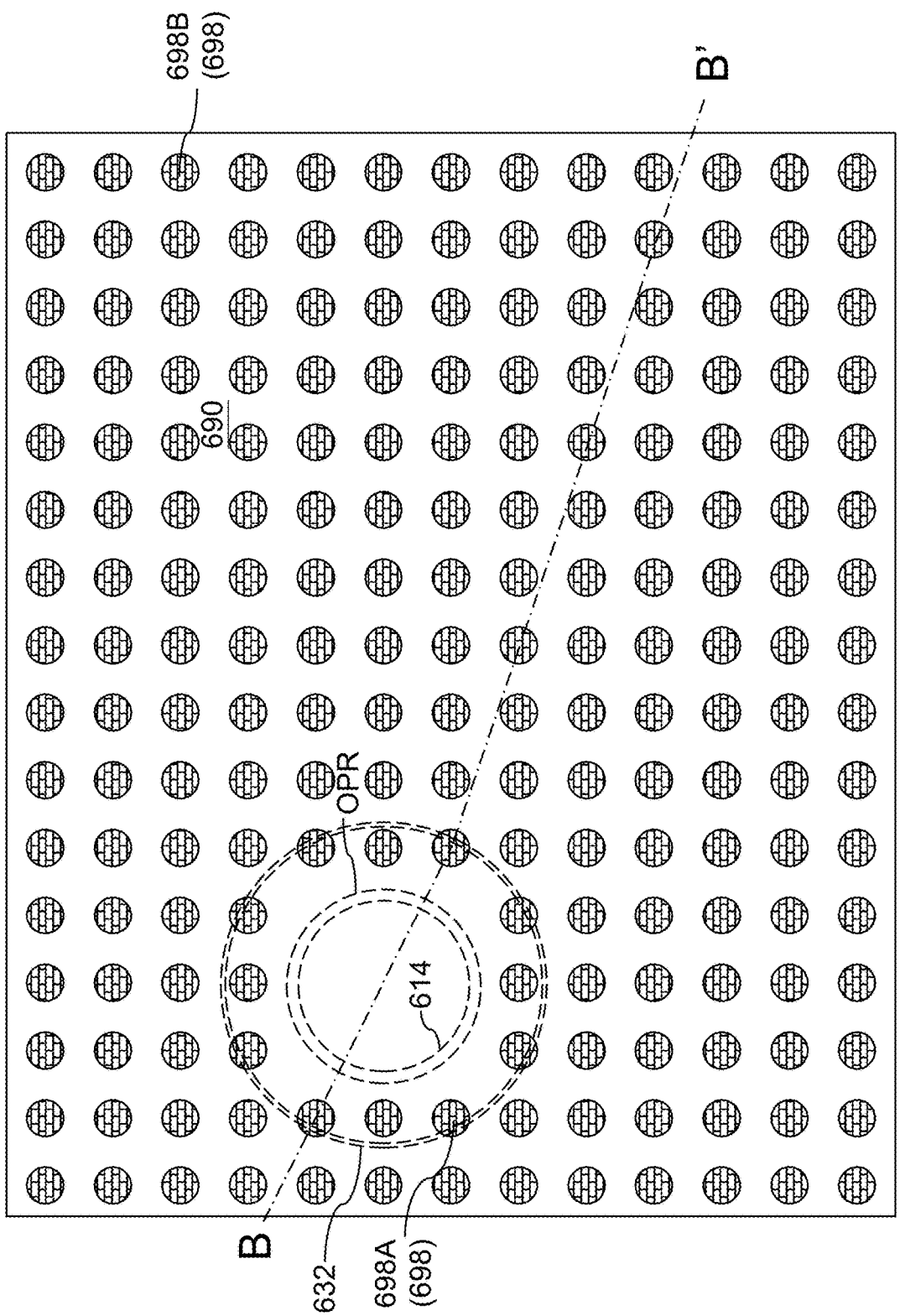
FIG. 19C is a top-down view of an alternative configuration of the second intermediate embodiment structure of FIG. 19A. The hinged vertical plane A-A' is the cut plane of the vertical cross-sectional view of FIG. 19A.

Referring to FIGS. 19A, 19B, and 19C, at least one metallic fill material may be deposited in the pad cavities 697 and via cavity portions 695 and subsequently planarized to form first metal bonding pads 698 and first bonding vias 696. For example, a metallic barrier liner and/or a metallic adhesion liner may be deposited by physical vapor deposition or chemical vapor deposition, and a metallic seed layer may be subsequently deposited by physical vapor deposition. The metallic barrier liner and/or the metallic adhesion liner may comprise a metallic barrier material such as TiN, TaN, WN, MoN, Ti, Ta, etc. Other suitable metallic materials are within the contemplated scope of disclosure. The metallic seed layer may comprise copper. Subsequently, a metallic fill material that may be used for metal-to-metal bonding may be deposited in the remaining volumes of the pad cavities 697 and via cavity portions 695. In an illustrative example, an electroplating process may be performed to deposit a metallic fill material such as copper in remaining volumes of the pad cavities 697 and via cavity portions 695. A planarization process, such as a chemical mechanical polishing process, may be performed to remove portions of the at least one metallic fill material from above the horizontal plane including the top surface of the first bonding-level dielectric layer 690. Remaining portions of the at least one metallic fill material comprise the first metal bonding pads 698 and first bonding vias 696.

The first metal bonding pads 698 may comprise first-type metal bonding pads 698A and second-type metal bonding pads 698B. The first-type metal bonding pads 698A fill the pad-level cavities 697A, and the second-type metal bonding pads 698B fill the integrated pad-and-via cavities 697B. The first-type metal bonding pads 698A are collectively referred as a first subset 698A of the first metal bonding pads, and the second-type metal bonding pads 698B are collectively referred to as a second subset 698B of the first metal bonding pads 698. Generally, the first metal bonding pads 698 may have rectangular shapes in the plan view as illustrated in FIG. 19B, may have circular shapes in the plan view as illustrated in FIG. 19C, or may have other two-dimensional closed shapes in the plan view.

According to an aspect of the present disclosure, the first subset 698A of the first metal bonding pads 698 has an areal overlap with the dielectric pillar structure 634 in a plan view (such as a top-down view of FIG. 19B or 19C), and the second subset 698B of the first metal bonding pads 698 is formed outside an area of the dielectric pillar structure 634 in the plan view. In other words, the first subset 698A of the first metal bonding pads 698 is formed with an areal overlap with the dielectric pillar structure 634 in the plan view. In one embodiment, at least one of the first subset 698A of the first metal bonding pads 698 has an areal overlap with a vertically-extending portion of the dielectric protection liner 632 that vertically extends through the first dielectric material layers 660 in the plan view. In some embodiments, at least one first-type metal bonding pad 698A of the first metal bonding pads 698 is located entirely within the area of the dielectric pillar structure 634 in the plan view, and does not have any areal overlap with the vertically-extending portion of the dielectric protection liner 632 that vertically extends through the first dielectric material layers 660 in the plan view. Each of the first metal bonding pads 698 may have a respective periphery having an areal overlap with the etch-stop dielectric layer 678. In one embodiment, all of the first metal bonding pads 698 may be formed outside the area of the optical path region OPR.

Each first metal bonding pad 698 within the second subset 698B of the first metal bonding pads 698 does not have any areal overlap with the dielectric pillar structure 634 in the plan view. The second subset 698B of the first metal bonding pads 698 may be formed entirely outside the area of the via cavity 631. In one embodiment, the second subset 698B of the first metal bonding pads 698 may be in contact with the horizontally-extending portion of the dielectric protection liner 632.

The optical path region OPR, which is free of any of the first metal bonding pads 698, is located over a center portion of the dielectric pillar structure 634. In one embodiment, the radius of the optical path region OPR is greater than a nearest neighbor distance selected from the second subset 698B of the first metal bonding pads 698. In one embodiment, the optical path region OPR has an areal overlap with the semiconductor lens 614 in the plan view. In one embodiment, the entire area of the semiconductor lens 614 may be located within the area of the optical path region OPR.

In one embodiment, each first metal bonding pad 698 may have the same thickness, which is not less than the thickness of the first bonding-level dielectric layer 690 above the etch-stop dielectric layer 678. Each first metal bonding pad 698 selected from the first metal bonding pads 698 comprises a respective bottom surface contacting a top surface of the etch-stop dielectric layer 678. The first bonding-level dielectric layer 690 is in contact with the etch-stop dielectric layer 678, and is vertically spaced from the dielectric protection liner 632.

An electronic integrated circuits (EIC) die 600 is formed in each unit area of the first embodiment structure, within which each semiconductor substrate 610 in a unit area is a portion of a semiconductor wafer. A two-dimensional periodic array of EIC dies 600 may be formed. Each EIC die 600 comprises a semiconductor substrate 610, a semiconductor lens 614 which comprises a portion of the semiconductor substrate 610 and has a convex semiconductor surface; semiconductor devices 620 located on a horizontal surface of the semiconductor substrate 610, first dielectric material layers 660 embedding first metal interconnect structures 680, a dielectric pillar structure 634 vertically extending through each layer selected from the first dielectric material layers 660 and having an areal overlap with the semiconductor lens 614 in a plan view; and a first bonding-level dielectric layer 690 embedding first metal bonding pads 698. A first subset 698A of the first metal bonding pads 698 has an areal overlap with the dielectric pillar structure 634 in the plan view.

Figure 20:
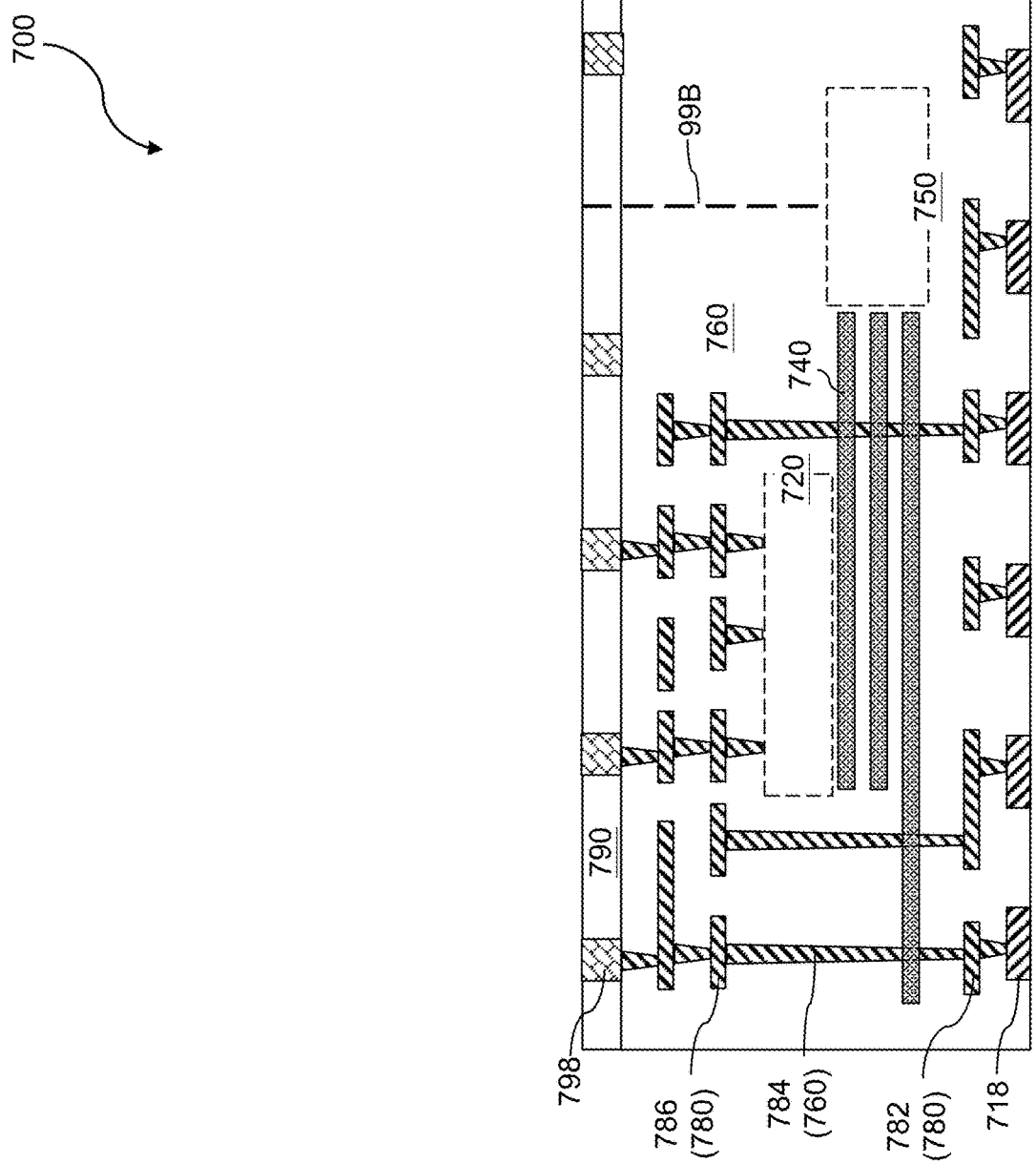
FIG. 20 is a vertical cross-sectional view of a photonic integrated circuits (PIC) die according to the second embodiment of the present disclosure.

Referring to FIG. 20, a photonic integrated circuits (PIC) die 700 according to the second embodiment of the present disclosure is provided. The PIC die 700 of FIG. 20 may be derived from the PIC die 700 of FIG. 8 by modifying the pattern of the second metal bonding pads 798 such that the pattern of the second metal bonding pads 798 is the mirror image pattern of the pattern of the first metal bonding pads 698 of the EIC die 600 illustrated in FIGS. 19A and 19B.

Figure 21:
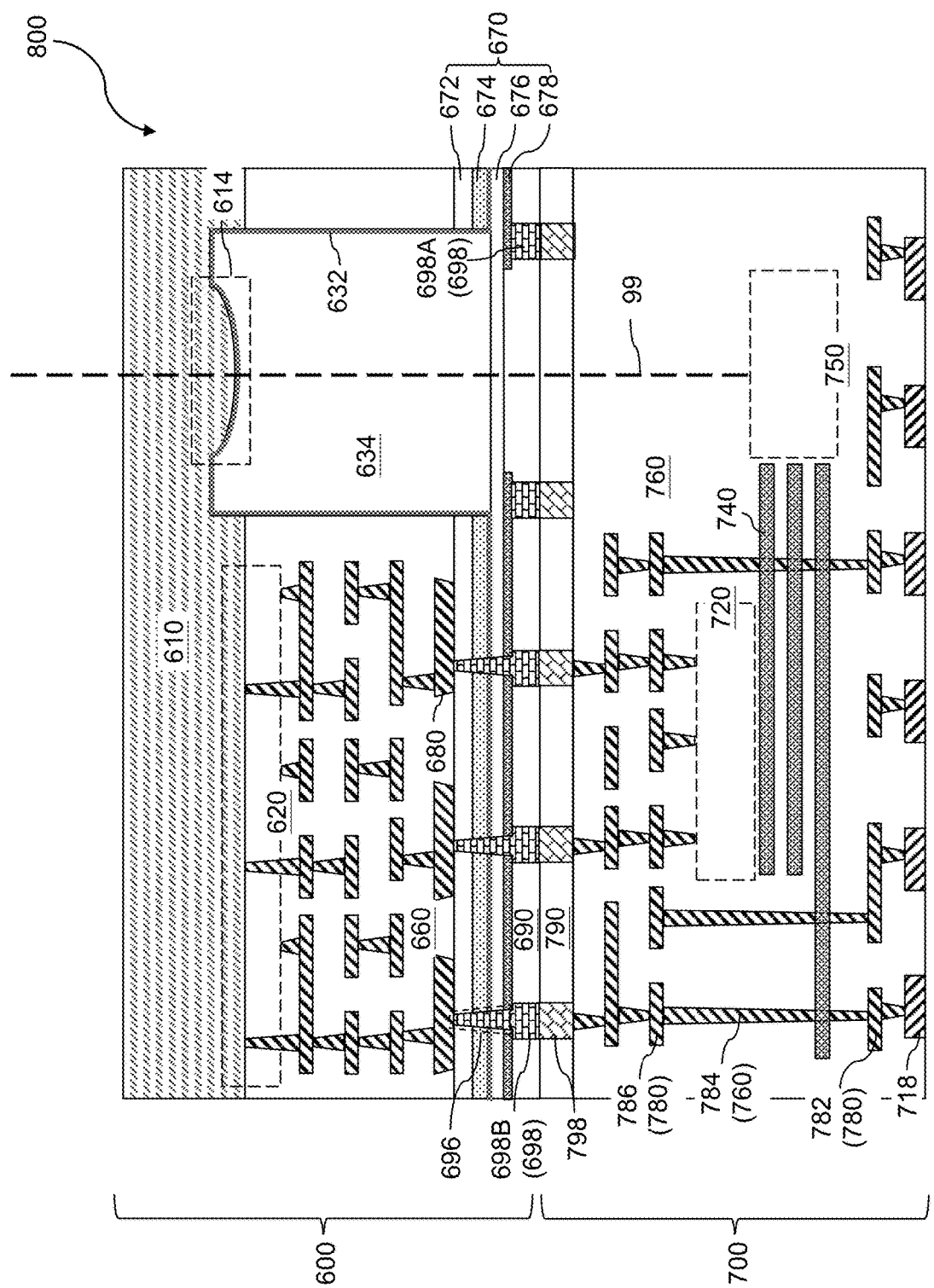
FIG. 21 is a vertical cross-sectional structure of the second intermediate embodiment structure after formation of a composite die including a bonded assembly of the PIC die and the EIC die according to the second embodiment of the present disclosure.

Referring to FIG. 21, the processing steps described with reference to FIG. 9 may be performed to form a composite die 800 including a bonded assembly of the PIC die 700 shown in FIG. 20 and the EIC die 600 shown in FIGS. 19A and 19B.

Figure 22:
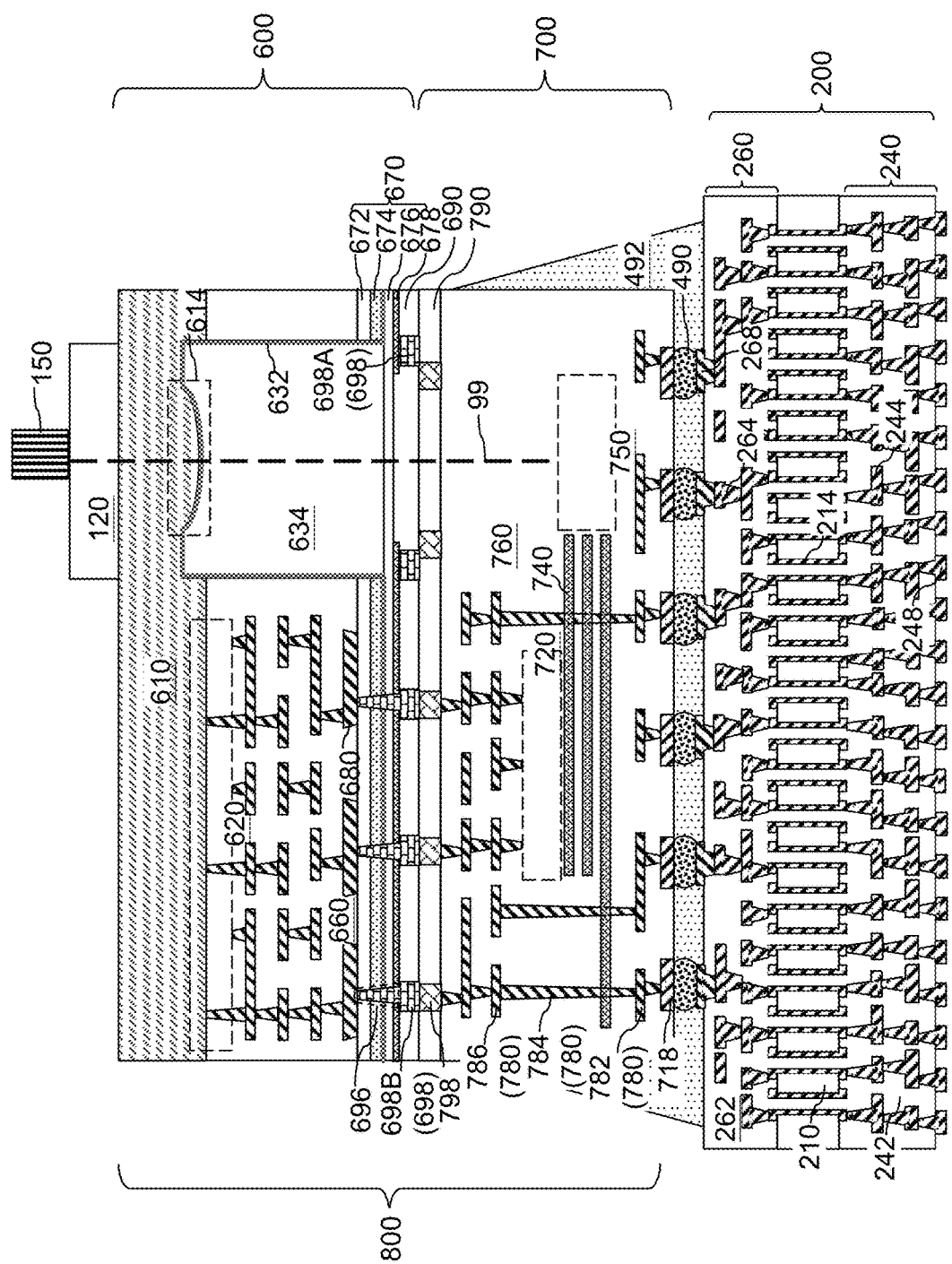
FIG. 22 is a vertical cross-sectional view of the second intermediate embodiment structure after attaching a fiber access unit and a packaging substrate to the composite die according to the second embodiment of the present disclosure.

Referring to FIG. 22, the processing steps described with reference to FIG. 10 may be performed to attach a packaging substrate 200 and a fiber access unit 120 to the composite die 800.

Figure 23:
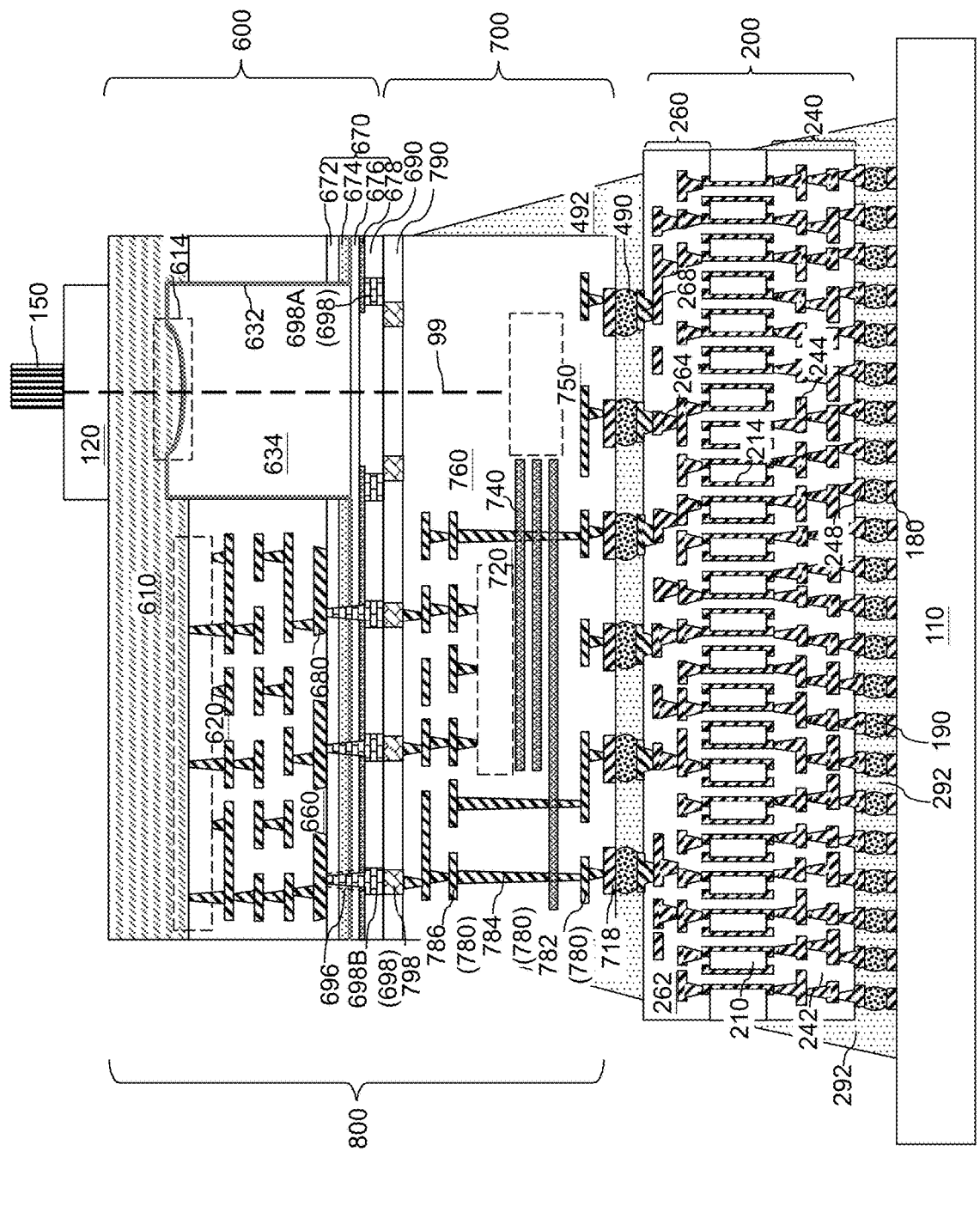
FIG. 23 is a vertical cross-sectional view of the second intermediate embodiment structure after attaching the packaging substrate to a printed circuit board according to the second embodiment of the present disclosure.

Referring to FIG. 23, the processing steps described with reference to FIG. 11 may be performed to attach the packaging substrate 200 to a printed circuit board 100.

FIG. 24 is a flowchart illustrating general processing steps for forming a photonic assembly of the present disclosure.

Referring to step 2410 and FIGS. 1 and 12, semiconductor devices 620 may be formed on a horizontal surface of a semiconductor substrate 610.

Referring to step 2420 and FIGS. 1 and 12, first metal interconnect structures 680 may be formed within first dielectric material layers 660 and over the semiconductor devices 620.

Referring to step 2430 and FIGS. 2A, 2B, 13A, and 13B, a via cavity 631 may be formed through the first dielectric material layers 660 such that a portion of the semiconductor substrate 610 is exposed underneath the via cavity 631.

Referring to step 2440 and FIGS. 3 and 14, a semiconductor lens 614 may be formed by patterning the portion of the semiconductor substrate 610 underneath the via cavity 631.

Referring to step 2450 and FIGS. 4, 5, 15, and 16, a dielectric pillar structure 634 may be formed by filling the via cavity 631 with a dielectric fill material.

Referring to step 2460 and FIGS. 6 and 17, a first bonding-level dielectric layer 690 may be formed over the first dielectric material layers 660 and the dielectric pillar structure 634.

Referring to step 2470 and FIGS. 7A, 7B, 18A, and 18B, first metal bonding pads 698 may be formed in the first bonding-level dielectric layer 690. An electronic integrated circuits (EIC) die 600 is formed. A first subset 698A of the first metal bonding pads 698 is formed with an areal overlap with the dielectric pillar structure 634 in a plan view.

Referring to all drawings and according to various embodiments of the present disclosure, a photonic assembly is provided, which comprises: an electronic integrated circuits (EIC) die 600 comprising a semiconductor substrate 610, semiconductor devices 620 located on a horizontal surface of the semiconductor substrate 610, first dielectric material layers 660 having formed therein first metal interconnect structures 680, a dielectric pillar structure 634 vertically extending through each layer selected from the first dielectric material layers 660, a first bonding-level dielectric layer 690 embedding first metal bonding pads 698, wherein a first subset 698A of the first metal bonding pads 698 has an areal overlap with the dielectric pillar structure 634 in a plan view; and a photonic integrated circuits (PIC) die 700 comprising waveguides 740, photonic devices 720, second dielectric material layers 760 embedding second metal interconnect structures 780, a second bonding-level dielectric layer 790 having second metal bonding pads 798 formed therein, wherein the second metal bonding pads 798 are bonded to the first metal bonding pads 698.

In one embodiment, the second metal bonding pads 798 are bonded to the first metal bonding pads 698 by metal-to-metal bonding in which the second metal bonding pads 798 are in direct contact with the first metal bonding pads 698. In one embodiment, the EIC die 600 further comprises a dielectric protection liner 632 laterally surrounding the dielectric pillar structure 634 and contacting each of the first dielectric material layers 660. In one embodiment, the EIC die 600 further comprises a semiconductor lens 614 which comprises a portion of the semiconductor substrate 610, has a convex semiconductor surface, and is located between the dielectric pillar structure 634 and the semiconductor substrate 610. In one embodiment, the dielectric protection liner 632 contacts the convex semiconductor surface of the semiconductor lens 614 and a vertically-extending sidewall of the semiconductor substrate 610.

In one embodiment, the EIC die 600 comprises passivation-level dielectric layers 670 located between the first dielectric material layers 660 and the first bonding-level dielectric layer 690; and a first one of the passivation-level dielectric layers 670 is located between the first dielectric material layers 660 and a horizontally-extending portion of the dielectric protection liner 632. In one embodiment, the first bonding-level dielectric layer 690 is in contact with the horizontally-extending portion of the dielectric protection liner 632.

In one embodiment, the first subset 698A of the first metal bonding pads 698 is not in direct contact with the horizontally-extending portion of the dielectric protection liner 632; and a second subset 698B of the first metal bonding pads 698 that does not have any areal overlap with the dielectric pillar structure 634 in the plan view is in contact with the horizontally-extending portion of the dielectric protection liner 632.

In one embodiment, a second one of the passivation-level dielectric layers 670 comprises an etch-stop dielectric layer 678 that is located between the horizontally-extending portion of the dielectric protection liner 632 and the first bonding-level dielectric layer 690; and each first metal bonding pad 698 selected from the first metal bonding pads 698 comprises a respective bottom surface contacting a top surface of the etch-stop dielectric layer 678. In one embodiment, the first bonding-level dielectric layer 690 is in contact with the etch-stop dielectric layer 678, and is vertically spaced from the dielectric protection liner 632.

According to another aspect of the present disclosure, a photonic assembly is provided, which comprises: an electronic integrated circuits (EIC) die 600 comprising a semiconductor substrate 610, a semiconductor lens 614 which comprises a portion of the semiconductor substrate 610 and has a convex semiconductor surface; semiconductor devices 620 located on a horizontal surface of the semiconductor substrate 610, first dielectric material layers 660 having formed therein first metal interconnect structures 680, a dielectric pillar structure 634 vertically extending through each layer selected from the first dielectric material layers 660 and having an areal overlap with the semiconductor lens 614 in a plan view; and a first bonding-level dielectric layer 690 embedding first metal bonding pads 698, wherein a first subset 698A of the first metal bonding pads 698 has an areal overlap with the dielectric pillar structure 634 in the plan view; and a photonic integrated circuits (PIC) die 700 comprising waveguides 740, photonic devices 720, second dielectric material layers 760 embedding second metal interconnect structures 780, a second bonding-level dielectric layer 790 embedding second metal bonding pads 798, wherein the second metal bonding pads 798 are bonded to the first metal bonding pads 698.

In one embodiment, the EIC die 600 comprises a dielectric protection liner 632 laterally surrounding the dielectric pillar structure 634 and contacting each of the first dielectric material layers 660; the EIC die 600 comprises passivation-level dielectric layers 670 located between the first dielectric material layers 660 and the first bonding-level dielectric layer 690; and a first one of the passivation-level dielectric layers 670 is located between the first dielectric material layers 660 and a horizontally-extending portion of the dielectric protection liner 632. In one embodiment, an entirely of the first subset 698A of the first metal bonding pads 698 is located within an area defined by an inner sidewall of a vertically-extending portion of the dielectric protection liner 632 that vertically extends through the first dielectric material layers 660 in the plan view.

In one embodiment, each first metal bonding pad 698 within the first subset 698A of the first metal bonding pads 698 has a first thickness t1 that is greater than a thickness of the first bonding-level dielectric layer 690 and comprises a respective portion that protrudes into the dielectric pillar structure 634; and each first metal bonding pad 698 within a second subset 698B of the first metal bonding pads 698 that does not have any areal overlap with the dielectric pillar structure 634 in the plan view comprises a pad portion having a second thickness that is less than the first thickness and a via portion that extends through the dielectric protection liner 632. In one embodiment, at least one of the first subset 698A of the first metal bonding pads 698 has an areal overlap with a vertically-extending portion of the dielectric protection liner 632 that vertically extends through the first dielectric material layers 660 in the plan view.

The various embodiments of the present disclosure may be used to provide metal bonding pads in a peripheral region of the area of the dielectric pillar structure 634 that includes a vertical optical path 99 without blocking the optical beam. By providing the metal bonding pads in the peripheral region of the area of the dielectric pillar structure 634, the bonding strength between an EIC die 600 and a PIC die 700 may be increased, and structural reliability of the composite die 800 may be enhanced.

The foregoing outlines features of several embodiments so that those skilled in the art may better understand the aspects of the present disclosure. Each embodiment described using the term "comprises" also inherently discloses additional embodiments in which the term "comprises" is replaced with "consists essentially of" or with the term "consists of," unless expressly disclosed otherwise herein. Whenever two or more elements are listed as alternatives in a same paragraph of in different paragraphs, a Markush group including a listing of the two or more elements is also impliedly disclosed. Whenever the auxiliary verb "may" is used in this disclosure to describe formation of an element or performance of a processing step, an embodiment in which such an element or such a processing step is not performed is also expressly contemplated, provided that the resulting apparatus or device may provide an equivalent result. As such, the auxiliary verb "may" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photonic assembly comprising:
   an electronic integrated circuits (EIC) die comprising a semiconductor substrate, semiconductor devices located on a surface of the semiconductor substrate, first dielectric material layers embedding first metal interconnect structures, a dielectric pillar structure vertically extending through each layer selected from the first dielectric material layers, a first bonding-level dielectric layer having first metal bonding pads formed therein, wherein a first subset of the first metal bonding pads has an areal overlap with the dielectric pillar structure in a plan view; and
   a photonic integrated circuits (PIC) die comprising waveguides, photonic devices, second dielectric material layers embedding second metal interconnect structures, a second bonding-level dielectric layer having second metal bonding pads formed therein, wherein the second metal bonding pads are bonded to the first metal bonding pads.

2. The photonic assembly of claim 1, wherein the second metal bonding pads are bonded to the first metal bonding pads by metal-to-metal bonding in which the second metal bonding pads are in direct contact with the first metal bonding pads.

3. The photonic assembly of claim 1, wherein the EIC die further comprises a dielectric protection liner laterally surrounding the dielectric pillar structure and contacting each of the first dielectric material layers.

4. The photonic assembly of claim 3, wherein the EIC die further comprises a semiconductor lens which comprises a portion of the semiconductor substrate, has a convex semiconductor surface, and is located between the dielectric pillar structure and the semiconductor substrate.

5. The photonic assembly of claim 4, wherein the dielectric protection liner contacts the convex semiconductor surface of the semiconductor lens and a vertically-extending sidewall of the semiconductor substrate.

6. The photonic assembly of claim 3, wherein:
   the EIC die comprises passivation-level dielectric layers located between the first dielectric material layers and the first bonding-level dielectric layer; and
   a first one of the passivation-level dielectric layers is located between the first dielectric material layers and a horizontally-extending portion of the dielectric protection liner.

7. The photonic assembly of claim 6, wherein the first bonding-level dielectric layer is in contact with the horizontally-extending portion of the dielectric protection liner.

8. The photonic assembly of claim 6, wherein:
   the first subset of the first metal bonding pads is not in direct contact with the horizontally-extending portion of the dielectric protection liner; and
   a second subset of the first metal bonding pads that does not have any areal overlap with the dielectric pillar structure in the plan view is in contact with the horizontally-extending portion of the dielectric protection liner.

9. The photonic assembly of claim 6, wherein:
a second one of the passivation-level dielectric layers comprises an etch-stop dielectric layer that is located between the horizontally-extending portion of the dielectric protection liner and the first bonding-level dielectric layer; and
each first metal bonding pad selected from the first metal bonding pads comprises a respective bottom surface contacting a top surface of the etch-stop dielectric layer.

10. The photonic assembly of claim 9, wherein the first bonding-level dielectric layer is in contact with the etch-stop dielectric layer, and is vertically spaced from the dielectric protection liner.

11. A photonic assembly comprising:
an electronic integrated circuits (EIC) die comprising a semiconductor substrate, a semiconductor lens which comprises a portion of the semiconductor substrate and has a convex semiconductor surface; semiconductor devices located on a surface of the semiconductor substrate, first dielectric material layers having first metal interconnect structures formed therein, a dielectric pillar structure vertically extending through each layer selected from the first dielectric material layers and having an areal overlap with the semiconductor lens in a plan view; and a first bonding-level dielectric layer having first metal bonding pads formed therein, wherein a first subset of the first metal bonding pads has an areal overlap with the dielectric pillar structure in the plan view; and
a photonic integrated circuits (PIC) die comprising waveguides, photonic devices, second dielectric material layers embedding second metal interconnect structures, a second bonding-level dielectric layer having second metal bonding pads formed therein, wherein the second metal bonding pads are bonded to the first metal bonding pads.

12. The photonic assembly of claim 11, wherein:
the EIC die comprises a dielectric protection liner laterally surrounding the dielectric pillar structure and contacting each of the first dielectric material layers;
the EIC die comprises passivation-level dielectric layers located between the first dielectric material layers and the first bonding-level dielectric layer; and
a first one of the passivation-level dielectric layers is located between the first dielectric material layers and a horizontally-extending portion of the dielectric protection liner.

13. The photonic assembly of claim 12, wherein an entirely of the first subset of the first metal bonding pads is located within an area defined by an inner sidewall of a vertically-extending portion of the dielectric protection liner that vertically extends through the first dielectric material layers in the plan view.

14. The photonic assembly of claim 12, wherein:
each first metal bonding pad within the first subset of the first metal bonding pads has a first thickness that is greater than a thickness of the first bonding-level dielectric layer and comprises a respective portion that protrudes into the dielectric pillar structure; and
each first metal bonding pad within a second subset of the first metal bonding pads that does not have any areal overlap with the dielectric pillar structure in the plan view comprises a pad portion having a second thickness that is less than the first thickness and a via portion that extends through the dielectric protection liner.

15. The photonic assembly of claim 12, wherein at least one of the first subset of the first metal bonding pads has an areal overlap with a vertically-extending portion of the dielectric protection liner that vertically extends through the first dielectric material layers in the plan view.

16. A method of forming a device structure, the method comprising:
forming semiconductor devices on a horizontal surface of a semiconductor substrate;
forming first metal interconnect structures within first dielectric material layers over the semiconductor devices;
forming a via cavity through the first dielectric material layers such that a portion of the semiconductor substrate is exposed underneath the via cavity;
forming a semiconductor lens by patterning the portion of the semiconductor substrate underneath the via cavity;
forming a dielectric pillar structure by filling the via cavity with a dielectric fill material;
forming a first bonding-level dielectric layer over the first dielectric material layers and the dielectric pillar structure; and
forming first metal bonding pads in the first bonding-level dielectric layer, whereby an electronic integrated circuits (EIC) die is formed, and wherein a first subset of the first metal bonding pads is formed with an areal overlap with the dielectric pillar structure in a plan view.

17. The method of claim 16, further comprising:
providing a photonic integrated circuits (PIC) die comprising waveguides, photonic devices, second dielectric material layers embedding second metal interconnect structures, a second bonding-level dielectric layer embedding second metal bonding pads; and
attaching the PIC die to the EIC die by bonding the second metal bonding pads to the first metal bonding pads.

18. The method of claim 17, wherein:
the PIC die comprises an optical deflector located adjacent to a subset of the waveguides and configured to change light propagation direction between a horizontal direction passing through the subset of the waveguides and vertical direction passing through the second dielectric material layers; and
the PIC die and the EIC die are aligned to each other such that light impinging on, or emanating from, the optical deflector passes through the dielectric pillar structure and the semiconductor lens and a portion of the semiconductor substrate having an areal overlap with the dielectric pillar structure in the plan view.

19. The method of claim 16, wherein the second metal bonding pads are bonded to the first metal bonding pads by metal-to-metal bonding in which the second metal bonding pads are in direct contact with the first metal bonding pads.

20. The method of claim 16, wherein:
a second subset of the first metal bonding pads is formed outside an area of the dielectric pillar structure in the plan view;
an optical path region that is free of any of the first metal bonding pads is formed over a center portion of the dielectric pillar structure such that a radius of the optical path region is greater than a nearest neighbor distance selected from the second subset of the first metal bonding pads; and the optical path region has an areal overlap with the semiconductor lens in the plan view.

\* \* \* \* \*